(12) United States Patent  (10) Patent No.: US 8,592,845 B2
Chen  (45) Date of Patent: *Nov. 26, 2013

(54) WIRE-PIERCING LIGHT-EMITTING DIODE LAMPS

(75) Inventor: Johnny Chen, Sindian (TW)

(73) Assignee: Willis Electric Co., Ltd., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/115,346

(22) Filed: May 25, 2011

(65) Prior Publication Data

US 2011/0303939 A1   Dec. 15, 2011

Related U.S. Application Data

(63) Continuation of application No. 13/042,171, filed on Mar. 7, 2011.

(60) Provisional application No. 61/310,994, filed on Mar. 5, 2010.

(51) Int. Cl.
  *H01L 33/00* (2010.01)

(52) U.S. Cl.
  USPC ............................. 257/98; 257/99; 257/100

(58) Field of Classification Search
  USPC .................................................. 257/98–100
  See application file for complete search history.

(56) References Cited

U.S. PATENT DOCUMENTS

| | | |
|---|---|---|
| 2,570,751 A | 10/1951 | Benander |
| 2,636,069 A | 4/1953 | Gilbert |
| 4,631,650 A | 12/1986 | Ahroni |
| 4,777,573 A | 10/1988 | Liao |
| 4,779,177 A | 10/1988 | Ahroni |
| 4,807,098 A | 2/1989 | Ahroni |
| 4,899,266 A | 2/1990 | Ahroni |
| 5,051,877 A | 9/1991 | Liao |
| 5,109,324 A | 4/1992 | Ahroni |
| 5,121,310 A | 6/1992 | Ahroni |
| 5,218,233 A | 6/1993 | Takahashi |
| 5,350,315 A | 9/1994 | Cheng et al. |
| 5,366,386 A | 11/1994 | Liao |
| 5,380,215 A | 1/1995 | Huang |
| 5,389,008 A | 2/1995 | Cheng et al. |
| 5,626,419 A | 5/1997 | Lin |
| 5,702,268 A | 12/1997 | Lien et al. |
| 5,829,865 A | 11/1998 | Ahroni |
| 5,966,393 A * | 10/1999 | Hide et al. ............ 372/23 |
| 6,079,848 A | 6/2000 | Ahroni |

(Continued)

FOREIGN PATENT DOCUMENTS

| | | |
|---|---|---|
| CN | 201187701 | 1/2009 |
| WO | WO 91/10093 | 7/1991 |

OTHER PUBLICATIONS

U.S Appl. No. 13/042,171.*

(Continued)

*Primary Examiner* — Samuel Gebremariam
(74) *Attorney, Agent, or Firm* — Christensen Fonder P.A.

(57) ABSTRACT

A wire-piercing light-emitting diode (LED) a lead frame having a first lead and a second lead. The first lead has a first transition portion and a first bottom portion with a first cutting member, and the second lead having a second transition portion and a second bottom portion with a second cutting member.

20 Claims, 39 Drawing Sheets

(56) References Cited

U.S. PATENT DOCUMENTS

| | | |
|---|---|---|
| 6,147,367 A | 11/2000 | Yang et al. |
| 6,261,119 B1 | 7/2001 | Green |
| 6,328,593 B1 | 12/2001 | Chang et al. |
| 6,533,437 B1 | 3/2003 | Ahroni |
| 6,609,814 B2 | 8/2003 | Ahroni |
| 7,422,489 B1 | 9/2008 | Tseng |
| 2003/0142494 A1 | 7/2003 | Ahroni |
| 2004/0004435 A1 | 1/2004 | Hsu |
| 2004/0115984 A1 | 6/2004 | Rudy et al. |
| 2008/0007951 A1 | 1/2008 | Chan |
| 2008/0186731 A1 | 8/2008 | Graham |
| 2008/0205020 A1 | 8/2008 | Vich |
| 2009/0002991 A1 | 1/2009 | Huang |
| 2011/0215368 A1 | 9/2011 | Chen |
| 2011/0286223 A1 | 11/2011 | Chen |
| 2011/0305022 A1 | 12/2011 | Chen |

OTHER PUBLICATIONS

Application and File History for U.S. Appl. No. 13/042,171, filed Mar. 7, 2011. Inventor: Johnny Chen.

Application and File History for U.S. Appl. No. 13/115,373, filed May 25, 2011. Inventor: Johnny Chen.

Application and File History for U.S. Appl. No. 13/115,585, filed May 25, 2011. Inventor: Johnny Chen.

* cited by examiner

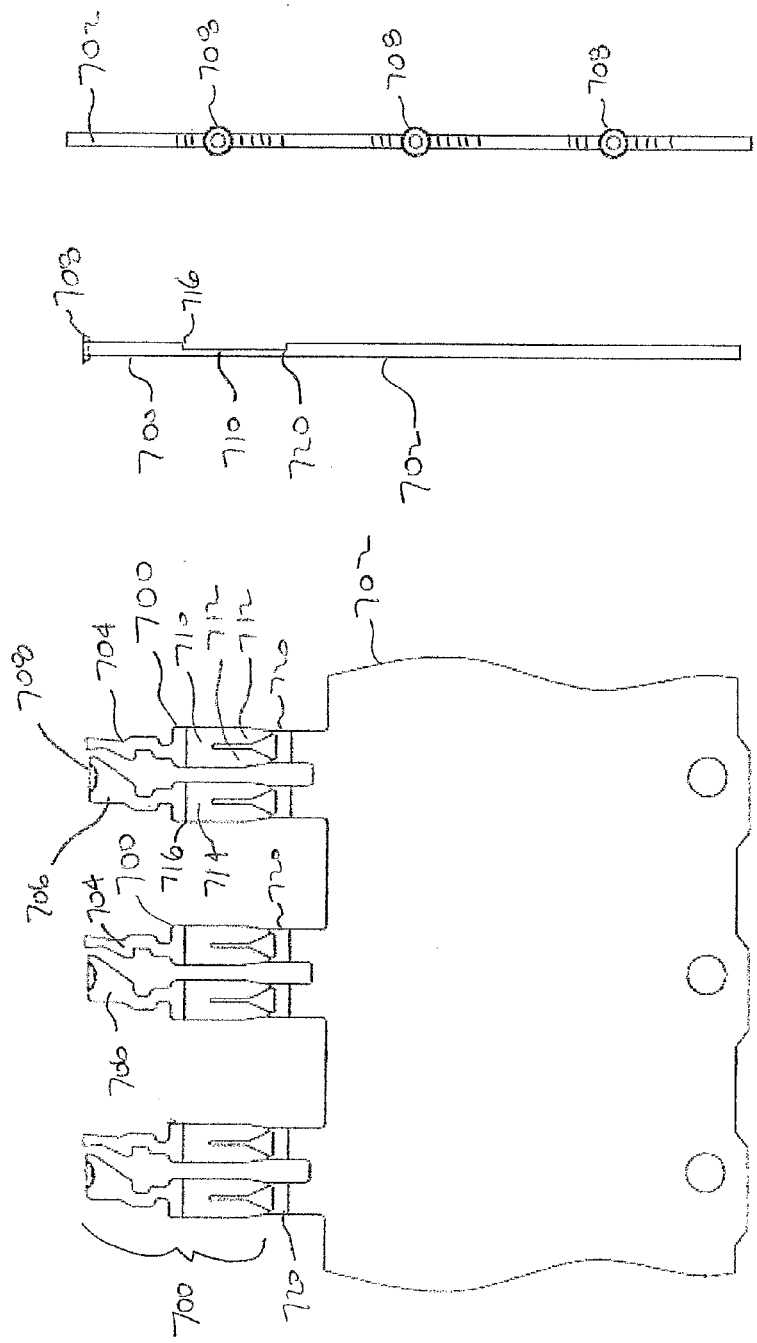

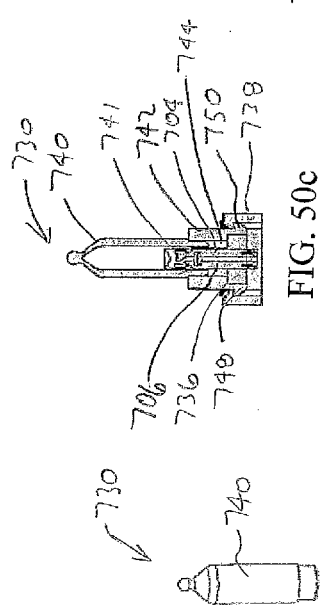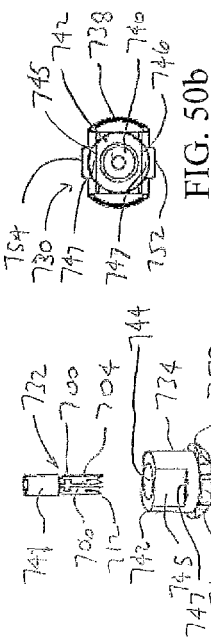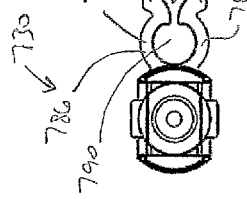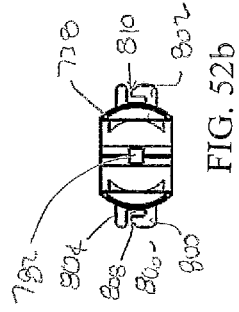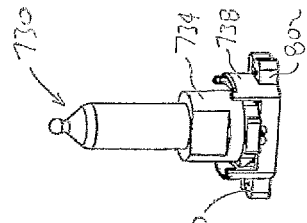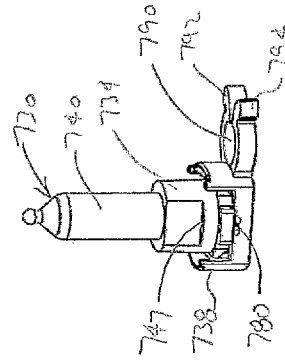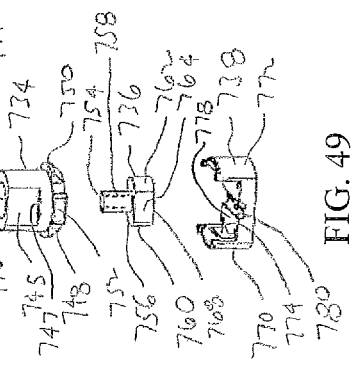

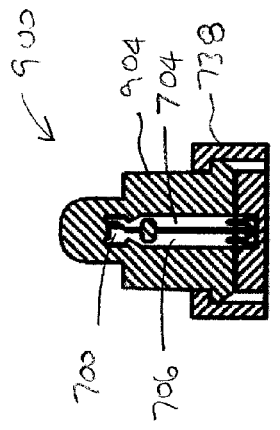
FIG. 53c
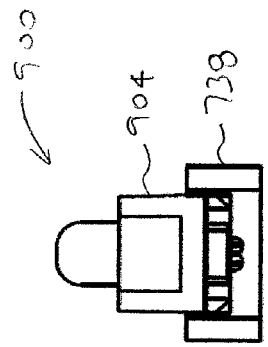
FIG. 53b
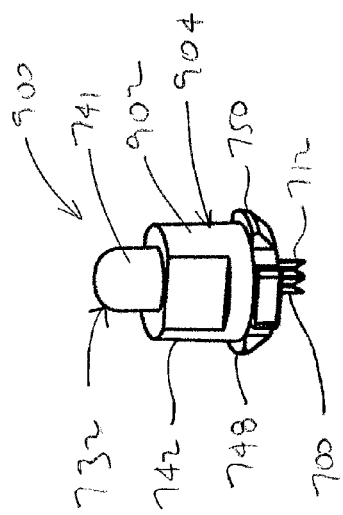
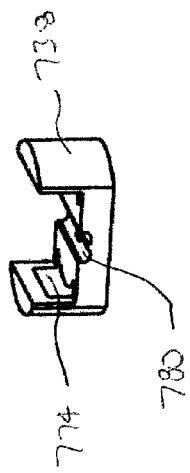
FIG. 53a

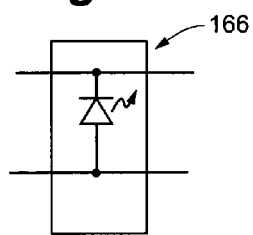
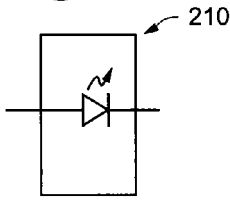
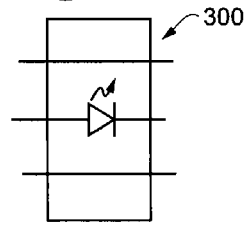
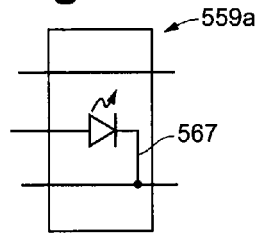
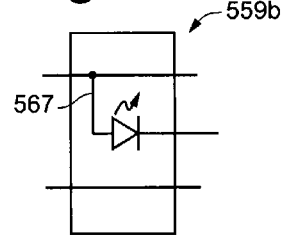
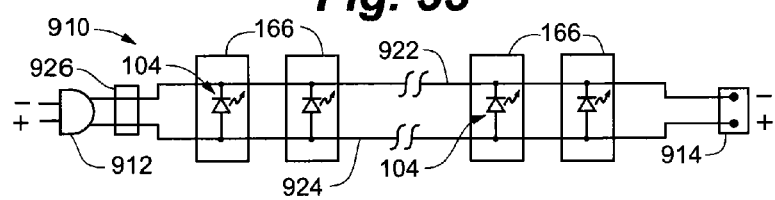
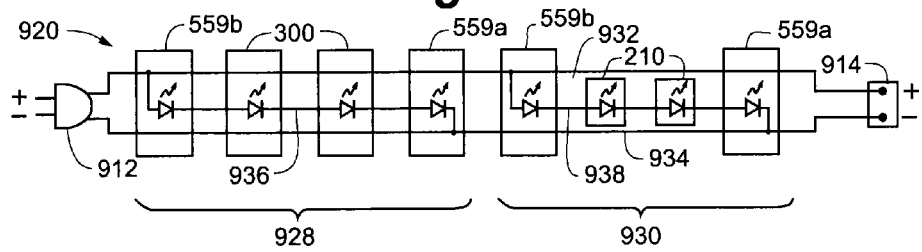

WIRE-PIERCING LIGHT-EMITTING DIODE LAMPS

RELATED APPLICATION

This application is a continuation of Application No. 13/042,171 filed Mar. 7, 2011, which claims the benefit of U.S. Provisional Application No. 61/310,994 filed Mar. 5, 2010, each of which is hereby fully incorporated herein by reference.

FIELD OF THE INVENTION

The present invention relates generally to light-emitting diode lamps. More particularly, the present invention relates to a light-emitting diode lamp that includes a lead frame for piercing portions of a wire to make consistent contact with a conductor of the wire.

BACKGROUND OF THE INVENTION

Light-emitting diode (LED) lamps provide a source of illumination for a variety of lighting applications, including decorative lighting, automotive lighting, architectural lighting, and other such applications. Depending on the particular application, LED chips may be packaged in a number of different ways to form the LED lamp. However, most conventional LED lamps are formed of an LED chip mounted to a lead-frame structure and encapsulated in an epoxy resin lens.

Conventional lead frames include a pair of leads, or electrodes, one to serve as the anode, the other as the cathode. An LED chip is mounted to the upper portion of the cathode, and a wire bond forms an electrical connection between the LED chip and the upper portion of the anode. When a proper voltage is applied to the electrode pair, current flows through the LED, and light is produced.

Such conventional lead frames are formed by a mechanical stamping process, with the lower portion of the leads consisting of narrow metallic strips which, when mounted in the LED lamp project perpendicularly away from the lens. Such leads may have a square or rectangular cross-section such that they form a post-like. This type of lead works well when the LED lamp is to be inserted into a circuit board or connected to a panel-like support structure.

However, for those applications requiring that the LED leads be coupled to an insulated conductor, such as a decorative light string, rather than, for example, a trace on a printed circuit board, connecting the leads of conventional LED lead frames to wiring poses significant challenges. In some cases, the leads may be soldered directly ends of the conductor to form a connection. In other cases, intermediate structures, such as wire terminals, or mechanical connectors, may be used. In any case, it can be difficult to make such connections, with the result being unreliable and inconsistent electrical and mechanical connection between the lead frame and the wiring. Such difficulties drive up the cost of manufacture, and potentially decrease the safety of the lighting product.

SUMMARY OF THE INVENTION

Various embodiments of the present invention are directed to wire-piercing light-emitting diode (LED) lead frames, lamps, illumination assemblies and decorative light strings, as well as methods related to using and manufacturing same.

In an embodiment, the present invention includes an LED lead frame for piercing wires having conductors surrounded by insulating material, thereby making electrical contact between the lead frame and the wires. The LED lead frame includes a first lead including a top portion that receives an LED and a bottom portion having at least one cutting member for piercing a first wire. The lead frame also includes a second lead including a top portion and a bottom portion with at least one cutting member for piercing a second wire. Further, the first lead and the second lead are spaced apart by a predetermined distance.

In another embodiment, the present invention comprises an LED lead frame that includes a first lead including a first transition portion forming a first shoulder, a first pair of cutting members, and defining a first wire-receiving recess, the first shoulder extending outward and away from the first pair of cutting members; and a second lead including a second transition portion forming a second shoulder, a second pair of cutting members, and defining a second wire-receiving recess, the second shoulder extending outward and away from the second pair of cutting members.

In yet another embodiment, the present invention comprises an LED lead frame that includes a first lead including a top portion and a bottom portion, the bottom portion having a cutting member for piercing a first wire, the cutting member defining a first wire-receiving channel, and a second lead including a top portion having a surface supporting an LED chip carrier and defining a horizontal plane, and a bottom portion, the bottom portion having at least one cutting member for piercing a second wire, the cutting member defining a second wire-receiving channel. The bottom portion of the first lead and the bottom portion of the second lead are coplanar and substantially perpendicular to the horizontal plane supporting the chip carrier.

In an embodiment, the present invention also includes a method of manufacturing a wire-piercing lead frame having first and second leads. The method includes forming a light-emitting diode chip carrier on a top surface of a lead-frame carrier, the lead frame carrier comprising a planar strip of conductive material; stamping out a first portion of the lead frame carrier to form a first lead of a wire-piercing lead frame, the first lead including a first cutting member, the first cutting member attached to the lead frame carrier at an end of the first cutting member; stamping out a second portion of the lead frame carrier to form a second lead of a wire-piercing lead frame, the first lead including the LED chip carrier at a top portion and a first cutting member at a bottom portion, the second cutting member attached to the lead frame carrier at an end of the second cutting member; separating the first lead and the second lead from the lead-frame carrier, thereby forming an LED lead frame having a first lead and a second lead.

In another embodiment, the present invention includes a method of manufacturing a wire-piercing lead frame that includes stamping out a first portion of a lead frame carrier to form a first lead of a wire-piercing lead frame, the first lead including a top portion and a bottom portion; stamping out a second portion of the lead frame carrier to form a second lead of a wire-piercing lead frame, the first lead including a top portion and a bottom portion, the top portion having an LED chip carrier, and wherein the top portion of the second lead is adjacent the top portion of the first lead; bending the first lead such that the top portion is substantially perpendicular to the bottom portion of the first lead; and bending the second lead such that the top portion is substantially perpendicular to the bottom portion of the second lead and the top portion of the second lead is coplanar to the top portion of the first lead.

In another embodiment, the present invention comprises an LED lamp for piercing insulated wires of a lighting device so as to make electrical contact between the lamp and the wires of the lighting device. The LED lamp includes a light-emitting diode lead frame including a conductive first lead and a conductive second lead, the first lead having a first cutting member; a light-emitting diode mounted to the lead frame, the light-emitting diode electrically connected to the first lead and electrically connected the second lead; and a lens adjacent the light-emitting diode and covering at least a portion of the first lead and a portion of the second lead so as to fix a position of the portion of the first lead relative to the portion of the second lead.

In another embodiment of an LED lamp, the first lead further includes a top portion, a middle portion, and a bottom portion, the bottom portion comprising the cutting member, and the second lead further including a top portion, a middle portion, and a bottom portion, the bottom portion comprising a cutting member, and wherein the middle portion of the first lead and the bottom portion of the first lead project away from a center of the light-emitting diode lead frame in a forward direction such that a distance from the middle portion of the first lead to the center of the light-emitting diode lead frame defines a first offset, and wherein the middle portion of the second lead and the bottom portion of the second lead project away from the center of the LED lead frame in a rearward direction such that a distance from the middle portion of the second lead to the center of the LED lead frame defines a second offset.

In another embodiment, the present invention comprises an LED lamp that includes a first lead including a first transition portion forming a first shoulder, a first pair of cutting members, and defining a first wire-receiving recess, the first shoulder extending outward and away from the first pair of cutting members; a second lead including a second transition portion forming a second shoulder, a second pair of cutting members, and defining a second wire-receiving recess, the second shoulder extending outward and away from the second pair of cutting members; a light-emitting diode supported by the first lead and electrically coupled to the first lead and the second lead; and a lens encapsulating the light-emitting diode and a portion of each of the first lead and the second lead, whereby the lens maintains a position of the first lead relative to the second lead.

In another embodiment, the present invention includes a method of manufacturing an LED lamp having a wire-piercing lead frame. The method includes the steps of: stamping out a first portion of the lead frame carrier to form a first lead of a wire-piercing lead frame, the first lead including a first cutting member; stamping out a second portion of the lead frame carrier to form a second lead of a wire-piercing lead frame, the second lead including a second cutting member; attaching an LED to the second lead such that the LED is electrically connected to the second lead; electrically connecting the LED to the first lead such that the first lead is in electrical connection with the second lead through the LED; encapsulating top portions of the LED, the first lead and the second lead, thereby fixing the position of the first lead with respect to the second lead and forming an LED lens; separating the first lead and the second lead from the lead-frame carrier, thereby forming an LED lamp having a first lead and a second lead.

In another embodiment, the present invention comprises an LED illumination assembly that includes: a retention housing including a top portion coupled to a bottom portion, the top portion defining an LED lamp-receiving recess; an LED lamp including a wire-piercing LED lead frame having first and second leads, the LED lamp inserted into the LED lamp-receiving recess of the top portion; a first wire including a conductor and an insulator, and a second wire including a conductor and an insulator, at least a portion of each of the first wire and the second wire located between the top portion and the bottom portion of the retention housing. Further, the first lead of the LED lead frame pierces at least a portion of the first insulator and the second lead of the LED lead frame pierces at least a portion of the second insulator, such that the first LED lead contacts the conductor of the first wire and the second LED lead contacts the conductor of the second wire.

Another embodiment of the present invention comprises an LED illumination assembly including a wire-piercing LED lamp and a retention housing for receiving the LED lamp. The retention housing has a housing top portion and a housing bottom portion that can be interlocked around one or more wires. The retention housing defines a recess for guiding the LED lamp as it pierces the insulation of the wire and retaining the LED lamp such that the first and second leads remain in contact with the wire conductors. The retention housing can also comprise notches for guiding the first and second cutting members as they pierce the insulation of the wire and retaining the ends of the cutting members to maintain the connection between the LED lamp and the wire conductors. According to an embodiment of the present invention, the top and bottom portions of the retention housing can be interlocked over a gap in a wire such that the first and second leads of the LED lamp engage the ends of the wire on either side of the gap to bridge the gap. The retention housing can comprise a wire divider that prevents the ends of the wire from contacting each other and closing the gap.

In another embodiment, the present invention comprises a single-wire LED illumination assembly that includes: a housing defining an LED lamp-receiving recess; an LED lamp including a wire-piercing LED lead frame having a first lead with a first cutting member defining a first plane and a second lead with a second cutting member defining a second plane, the LED lamp inserted into the LED lamp-receiving recess of the top portion; a wire including a forward portion and a rear portion, at least a portion of the wire retained by the housing, the first wire defining a gap between the forward portion and the rear portion. Further, the first lead of the LED lead frame pierces an insulator of the forward portion of the wire and contacts a conductor of the forward portion, and the second lead of the LED lead frame pierces an insulator of the rearward portion of the wire and contacts a conductor of the rear portion, such that the forward portion of the wire is electrically connected to the rearward portion of the wire through the LED lamp.

In another embodiment, the present invention includes an LED illumination assembly that includes: an LED lamp including a lead frame having a first wire-piercing lead with a first cutting member and a second wire-piercing lead with a second cutting member; a housing defining a central recess and a wire channel; and a retainer inserted into a bottom portion of the central recess of the housing. Further, the LED lamp is inserted into a top portion of the central recess of the housing and into contact with the retainer such that the first and second cutting members extend into the wire channel.

In another embodiment, the present invention comprises a decorative light string. The decorative light string includes: a first wire including a first conductor and a first insulator; a second wire including a second conductor and a second insulator; and a plurality of illumination assemblies electrically connected to the first wire and the second wire, each illumination assembly including an LED lamp having a wire-piercing lead frame with a first lead and a second lead and an LED. Each first lead of each LED lamp pierces a portion of the first insulator to make an electrical connection with the first conductor, and each second lead of each LED lamp pierces a portion of the second insulator to make an electrical connection with the second conductor, thereby causing each of the plurality of LED lamps to be in parallel electrical connection to the other.

In another embodiment, the present invention comprises a decorative light string that includes: a first wire including a first insulator and a first conductor; a second wire including a second insulator and a second conductor; a first illumination assembly including a first LED lamp having a first lead and a second lead, the first lead piercing an insulation of the first wire to make an electrical connection with the first conductor; a second illumination assembly including a second LED lamp having a first lead and a second lead, the second lead piercing the second insulator to make an electrical connection with the second conductor. Further, the second lead of the first LED lamp is electrically connected to the first lead of the second LED lamp such that the first LED lamp and the second LED lamp are electrically connected in series between the first wire and the second wire.

The above summary of the various representative embodiments of the invention is not intended to describe each illustrated embodiment or every implementation of the invention. Rather, the embodiments are chosen and described so that others skilled in the art can appreciate and understand the principles and practices of the invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 48a is a front view of a lead-frame carrier including three lead-frames, according to an embodiment of the present invention;

FIG. 48b is a left-side view of the lead-frame carrier with lead-frames of FIG. 48a;

FIG. 48c is a top view of the lead-frame carrier with lead frames of FIG. 48a;

FIG. 49 is an exploded, front perspective view of an LED illumination assembly, according to an embodiment of the present invention;

FIG. 50a is a front view of the assembled LED illumination assembly of FIG. 49;

FIG. 50b is a top view of the assembled LED illumination assembly of FIG. 49;

FIG. 50c is a cross-sectional view of the assembled LED illumination assembly of FIG. 49;

FIG. 51a is a front perspective view of an LED illumination assembly having a branch clip, according to an embodiment of the present invention;

FIG. 51b is a top view of the LED illumination assembly of FIG. 51a;

FIG. 52a is a front perspective view of an LED illumination assembly including a wire clip, according to an embodiment of the present invention;

FIG. 52b is a top view of a housing bottom portion of the LED illumination assembly of FIG. 52a;

FIG. 53a is an exploded, front perspective view of another LED illumination assembly, according to an embodiment of the present invention;

FIG. 53b is a front view of the assembled LED illumination assembly of FIG. 53a;

FIG. 53c is a sectional view of the LED illumination assembly of FIG. 53b;

FIG. 54a is a block diagram and electrical schematic of a two-wire LED illumination assembly, according to an embodiment of the present invention;

FIG. 54b is a block diagram and electrical schematic of a single-wire LED illumination assembly, according to an embodiment of the present invention;

FIG. 54c is a block diagram and electrical schematic of a three-wire LED illumination assembly, according to an embodiment of the present invention;

FIG. 54d is a block diagram and electrical schematic of a three-wire LED illumination assembly including a jumper, according to an embodiment of the present invention;

FIG. 54e is a block diagram and electrical schematic of another three-wire LED illumination assembly including a jumper, according to an embodiment of the present invention;

FIG. 55 is a block diagram and electrical schematic of a decorative light string, according to an embodiment of the present invention; and FIG. 56 is a block diagram and electrical schematic of another decorative light string, according to an embodiment of the present invention.

Figure 1:
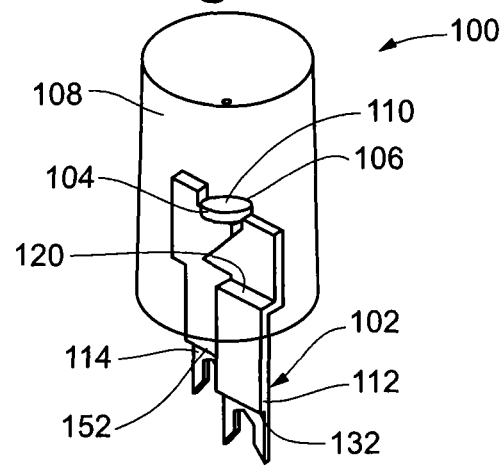
FIG. 1 is a perspective view of a wire-piercing LED lamp according to an embodiment of the present invention.
Figure 2:
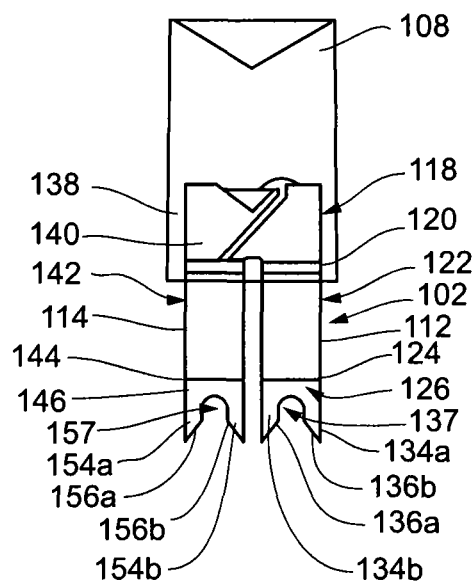
FIG. 2 is a front view of the LED lamp of FIG. 1.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Referring to FIGS. 1-4, an embodiment of a light-emitting diode (LED) lamp 100 of the present invention is depicted. LED lamp 100 includes lead frame 102, LED chip 104, lead-chip connector 106, and lens 108. In some embodiments, LED lamp 100 may also include LED chip carrier 110.

In one embodiment, lead frame 102 includes first lead 112 and second lead 114, and may be comprised of any known conductive materials, including metallic materials such as aluminum, copper, bronze, tin, or similar such conductive materials. First lead 112 and second lead 114 are separated such that leads 112 and 114 are not in direct contact with each other, and such that the leads define side-to-side gap 116. Gap 116 may vary along a length of lead frame 102.

First lead 112 includes top portion 118, forward-projecting ledge 120, middle portion 122, transition portion 124, and bottom portion 126.

Top portion 118 may generally be triangular in shape as depicted, though it will be understood that top portion 118 may assume other shapes as required to meet the particular structural and aesthetic requirements of LED lamp 100. Top portion 118 extends in a generally downward direction to meet forward-projecting ledge 120. In other embodiments, top portion 118 connects to chip carrier 110 at a side portion, and extends in a horizontal direction before extending downward to meet forward-projecting ledge 120. Forward-projecting ledge 120 projects away from top portion 118 in a generally forward direction. As depicted, forward-projecting ledge 120 forms a substantially 90° angle with top portion 118, though projecting ledge 120 and top portion 118 may form angles other than 90° angles in other embodiments.

Middle portion 122 may generally be rectangular in shape as depicted, though it will be understood that middle portion 122 may assume other shapes as required. Middle portion 122 projects generally downward and away from forward-projecting ledge 120, such that middle portion 122 and top portion 118 lie in different planes, and are separated in a forward-to-rearward direction by offset 130.

Figure 3:
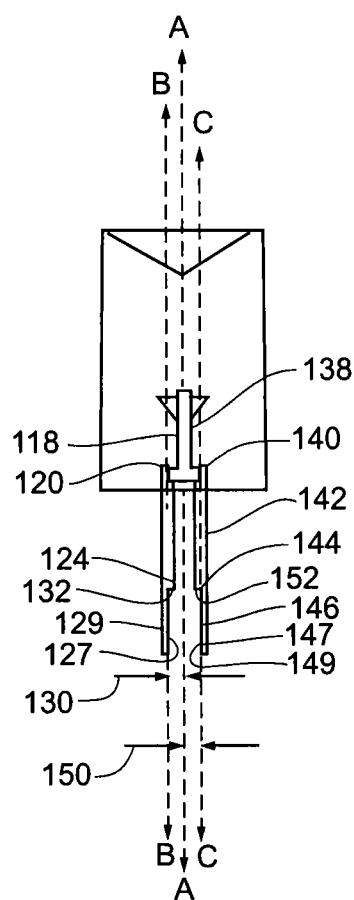
FIG. 3 is a right-side view of the LED lamp of FIG. 1.

Referring specifically to FIG. 3, top portion 118 lies in a plane that includes axis A-A, while middle portion 122 lies in a plane that includes axis B-B. Offset 130 is the distance between planes including axis A-A and axis B-B. Offset 130 also defines a length of forward-projecting ledge 120. As discussed further below, offset 130 may vary to accommodate different lead frames 102 adapted to work with specific wire and conductor sizes.

As depicted, offset 130 defines a constant distance between planes that include top portion 118 and middle portion 122. However, in other embodiments wherein top portion 118 and middle portion 122 do not lie in parallel planes, offset 130 may vary such that it is greatest at a point furthest from top portion 118 and least at a point closest top portion 120.

Figure 4:
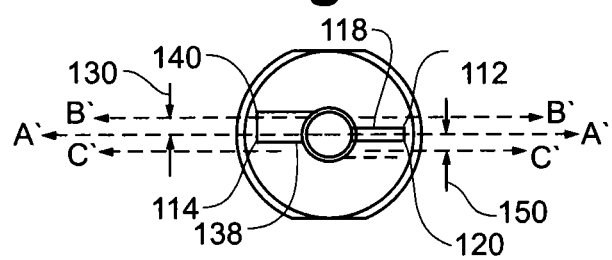
FIG. 4 is a top view of the LED lamp of FIG. 1.

Referring specifically to FIG. 4, offset 130 is also depicted as the distance between axis A'-A' and axis B'-B', where axis A'-A' is perpendicular to, and lies in the same plane as, axis A-A, and axis B'-B' is perpendicular to, and lies in the same plane as, axis B-B. Referring again to FIGS. 1-4, middle portion 122 transitions to bottom portion 126 at transition portion 124. As depicted, transition portion 124 forms a shoulder or step and includes transition surface 132. Transition surface 132 may be planar, and generally parallel to a plane formed by forward-projecting ledge 120, and not coplanar to bottom portion 126. However, in other embodiments, wherein transition portion 124 comprises other transition features, transition surface 132 may lie in a plane not parallel to a plane formed by ledge 120. In one such embodiment, middle portion 122 is substantially the same thickness as bottom portion 126, and transition surface 132 is substantially planar with both middle portion 124 and bottom portion 126.

In the embodiment depicted, bottom portion 126 includes front surface 127, rear surface 129, and cutting members 134a and 134b. Bottom portion 126 defines conductor receiving recess 137. Cutting members 134a and 134b include cutting edges 136a and 136b, respectively.

As depicted, cutting edges 136a and 136b angle inwards and towards wire-receiving recess 137. In other embodiments, cutting edges 136a and 136b may angle more or less steeply towards conductor-recess 137. In other embodiments, bottom portion 126 may include only a single cutting member. In an embodiment, bottom portion 126 is integral to middle portion 122 or top portion 118, rather than forming a separable component.

Wire-receiving recess 137 may be formed by arcuate and linear edge portions of bottom portion 126 as depicted, but may form other generally semi-circular, square, slotted, V, or other shapes. As described further below, an arcuate shaped wire-receiving recess 137 maximizes contact with conductors of wires while potentially minimizing cutting of the conductor. Second lead 114 includes top portion 138, rearward-projecting ledge 140, middle portion 142, transition portion 144, and bottom portion 146.

Top portion 138 may generally be triangular in shape as depicted, though it will be understood that top portion 138 may assume other shapes as required to meet the particular structural and aesthetic requirements of LED lamp 100. As discussed further below, top portion 138 may be configured to receive optional LED chip carrier 110 by including a step, recess, or other appropriate-sized cavity. In other embodiments, top portion 138 may be adapted to receive LED chip 104 mounted directly to a top surface of top portion 138. Top portion 138 extends in a generally downward direction to meet rearward-projecting ledge 140.

Rearward-projecting ledge 140 projects away from top portion 138 in a generally rearward direction, and in one embodiment is substantially similar to forward-projecting ledge 120, with the exception of the direction of projection. As depicted, rearward-projecting ledge 140 forms a substantially 90° angle with top portion 138, though rearward-projecting ledge 140 and top portion 138 may form angles other than 90° angles in other embodiments.

Middle portion 142 in the depicted embodiment is substantially similar to middle portion 122. Middle portion 142 may generally be rectangular in shape as depicted, though it will be understood that middle portion 142 may assume other shapes as required. Middle portion 142 projects generally downward and away from rearward-projecting ledge 140, such that middle portion 142 and top portion 138 lie in different planes, and are separated in a rearward-to-forward direction by offset 150.

Referring specifically to FIG. 3, top portion 138 lies in a plane that includes axis A-A, while middle portion 142 lies in a plane that includes axis C-C. Offset 150 is the distance between planes including axis A-A and axis C-C. Offset 150 also defines a length of rearward-projecting ledge 120. As discussed further below, offset 150 may vary to accommodate different lead frames 102 adapted to work with specific wire and conductor sizes.

As depicted, offset 150 defines a constant distance between planes that include top portion 138 and middle portion 142. However, in other embodiments, wherein top portion 138 and middle portion 142 do not lie in parallel planes, offset 150 may vary such that it is greatest at a point furthest from top portion 138 and least at a point closest top portion 140.

Referring specifically to FIG. 4, offset 150 is also depicted as the distance between axis A'-A' and axis C'-C', where axis A'-A' is perpendicular to, and lies in the same plane as, axis A-A, and axis C'-C' is perpendicular to, and lies in the same plane as, axis C-C.

Referring again to FIGS. 1-4, middle portion 142 transitions to bottom portion 146 at transition portion 144. As depicted, transition portion 144 may include transition surface 152. In one embodiment, transition surface 152 is planar, and generally parallel to a plane formed by forward-projecting ledge 140. However, in other embodiments, whereas transition portion 144 comprises other transition features, transition surface 152 may lie in a plane not parallel to a plane formed by ledge 140. In one such embodiment, middle portion 142 is substantially the same thickness as bottom portion 146, and transition surface 152 is substantially planar with both middle portion 144 and bottom portion 146.

In the embodiment depicted, bottom portion 146 is substantially the same as bottom portion 126. Bottom portion 146 includes front surface 147, rear surface 149, and cutting members 154a and 154b. Bottom portion 146 defines conductor receiving recess 157. Cutting members 154a and 154b include cutting edges 156a and 156b, respectively. As depicted, cutting edges 156a and 156b angle inwards and towards wire-receiving recess 157. In other embodiments, cutting edges 156a and 156b may angle more or less steeply towards conductor-recess 157.

Wire-receiving recess 157 may be formed by arcuate and linear edge portions of bottom portion 146 as depicted, but may form other generally semi-circular, square, slotted, or other shapes.

LED chip 104 may be one or more of any of known light-emitting diode chips or dies. LED chip 104 may comprise one or more light-emitting diodes and may also comprise other electronic devices within, or without, the chip package. LED chip 104 may operate on AC or DC power, and at varying voltages, as will be understood by those skilled in the art. Other electronic devices may include zener diodes, other types of non-light-emitting diodes, control circuitry, and so on.

Lead-chip connector 106 forms an electrical connection between LED chip 104 and lead 112. In one embodiment, as depicted, lead-chip connector 106 comprises wire bonding. In other embodiments, lead-chip connector 106 may comprise flip-chip, or other known technology, to form an electrical connection between LED chip 104 and lead 112.

Lens 108 encapsulates portions of lead frame 102, LED chip 104, connector 106 and carrier 110, and comprises a transparent or semi-transparent plastic material such as an epoxy resin. Lens 108 may comprise other similar materials as understood by those skilled in the art. By encapsulating portions of lead frame 102, LED chip 104, connector 106, and carrier 110, lens 108 holds the relative positions of these components fixed, including the position of lead 112 to lead 112. Although lens 108 is depicted as comprising a generally cylindrical shape, it will be understood that lens 108 may comprise any of a variety of known shapes and sizes.

LED lamp 100 may also include optional LED chip carrier 110. As depicted, LED chip carrier 110 comprises a bowl-shaped structure that may also include a reflective inner surface. It will be understood that if present, LED chip carrier 110 may comprise other known structures and shapes.

When assembled, LED chip 104 is mounted directly to lead 114, or to LED chip carrier 110, which is in turn mounted to lead 114. Lead-chip connector 106 forms an electrical connection between LED chip 104 and lead 112. In this configuration, lead 112 serves as the positive electrode, or anode, while lead 114 serves as the negative electrode, or cathode. However, in another embodiment, top portion of lead 112 could be adapted to receive LED 104 such that it serves as the cathode, while lead 114 serves as the anode. Lens 108 holds the assembly together, forming an encapsulation or housing around the other components to form LED lamp 100.

Referring to FIGS. 5-8, LED lamp 100 may be combined with retention housing 160 and wires 162 and 164 to form LED illumination assembly 166. LED illumination assembly 166 may comprise a portion of a lighting system or string that includes multiple LED illumination assemblies 166. Alternatively, LED illumination assembly 166 may comprise a stand-alone assembly for providing illumination via a single LED lamp 100.

Figure 5:
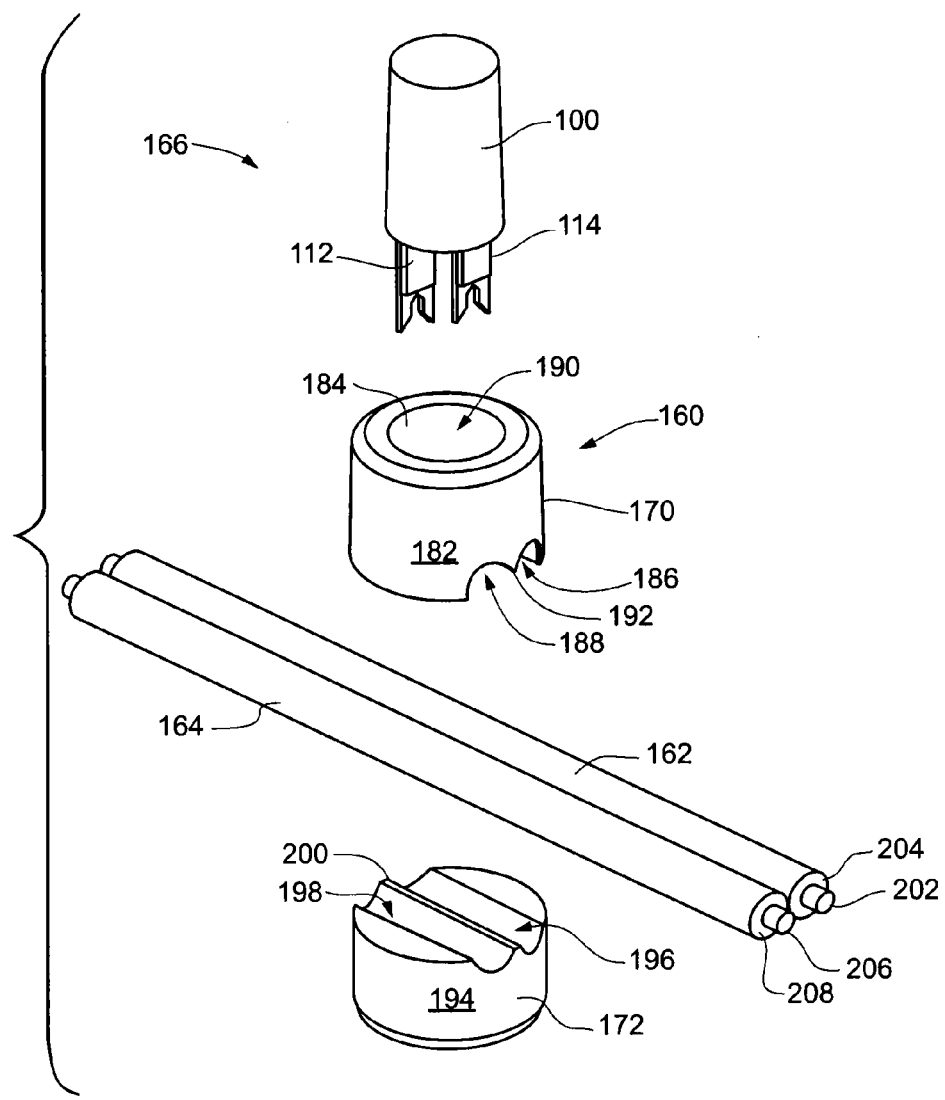
FIG. 5 is an exploded view of a two-wire LED illumination assembly according to an embodiment of the present invention.

Referring specifically to FIG. 5, retention housing 160 includes housing top portion 170 and housing bottom portion 172, and may be constructed of a plastic or polymer material, ceramic, or other such material.

Top portion 170 may be generally cylindrical as depicted, but it will be understood that top portion 170 may comprise other shapes. Top portion 170 includes outer surface 182 and inner surface 184, and defines first wire channel or upper groove 186, second upper groove 188, and LED lamp receiving recess 190. Upper ridge 192 is formed between first upper groove 182 and second upper groove 184.

First upper groove 186 is sized to receive a portion of wire 162, while second upper groove 188 is sized to receive an upper portion of wire 164.

Bottom portion 172 may form a disk-like, cap-like, or similar structure, and includes outer surface 194, top surface. Bottom portion 172 defines first wire channel or lower groove 196 and second lower groove 198. Lower ridge 200 is formed between first lower groove 196 and second lower groove 198.

First lower groove 196 is sized to receive a lower portion of wire 162, while second lower groove 198 is sized to receive a lower portion of wire 164.

Wire 162 includes conductor 202 and insulator 204; wire 164 includes conductor 206 and insulator 208.

Figure 6:
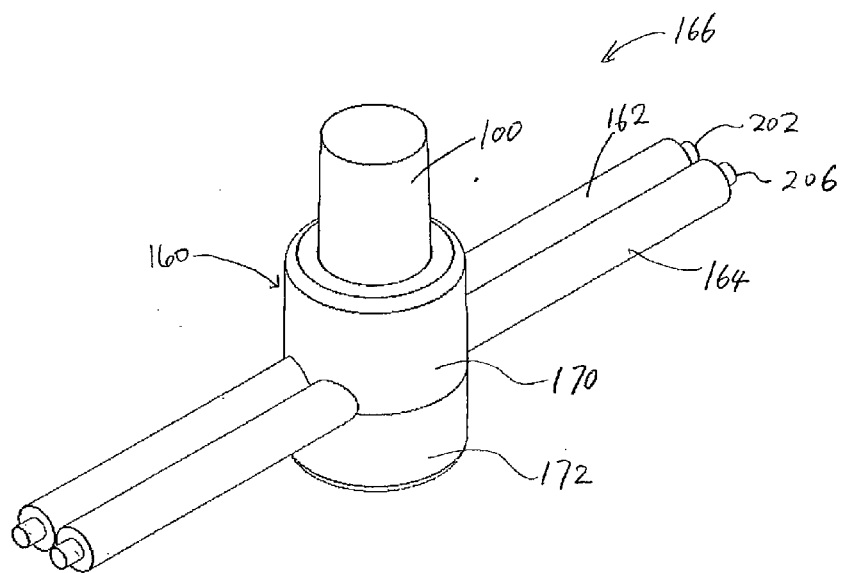
FIG. 6 is a perspective view of the assembled two-wire LED illumination assembly of FIG. 5.
Figure 7:
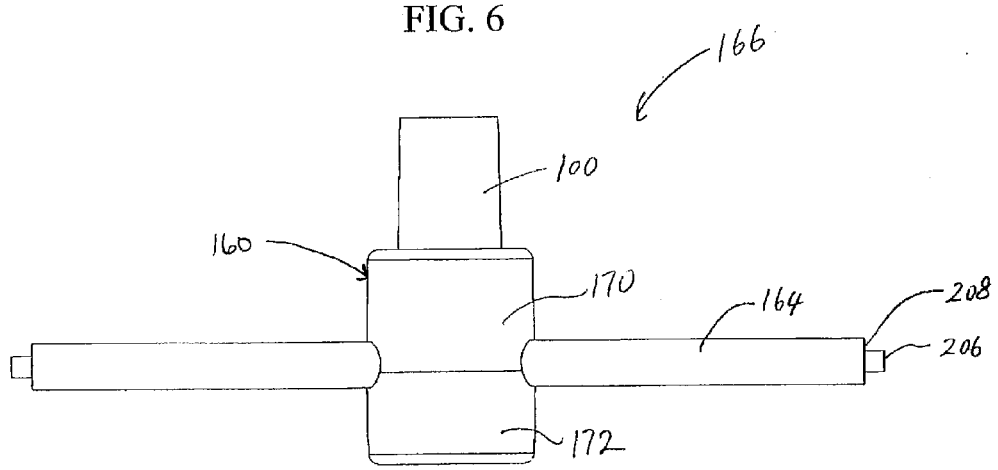
FIG. 7 is a front view of the LED illumination assembly of FIG. 6.
Figure 8:
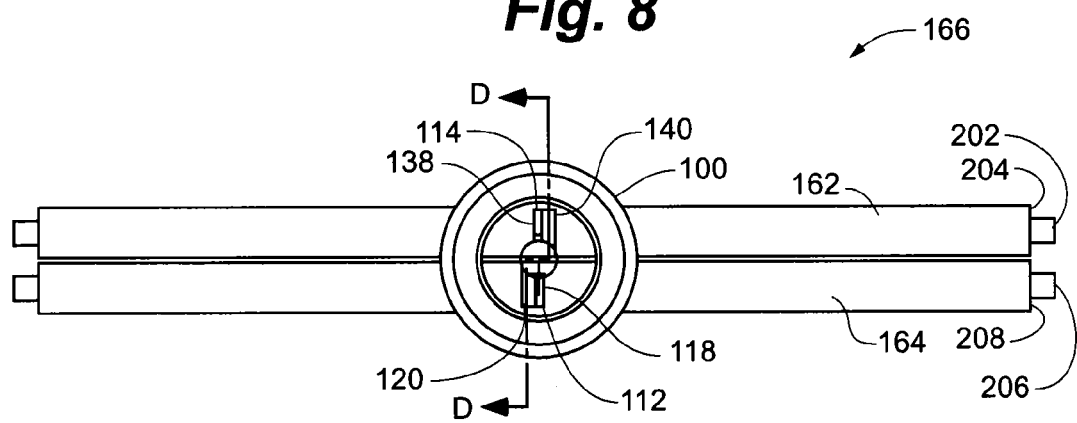
FIG. 8 is a top view of the LED illumination assembly of FIG. 6.

Referring also to FIGS. 6-8, when assembled, LED lamp 100 is inserted into LED lamp-receiving recess 190. Housing top portion 170 is coupled to housing lower portion 172, with wires 162 and 164 between top and bottom portions 170 and 172. Wire 162 is securely received by upper and lower grooves 186 and 196, while wire 164 is securely received by upper and lower grooves 188 and 198. In one embodiment, upper ridge 192 contacts upper portions of wires 162 and 164, while lower ridge 200 contacts lower portions of wires 162 and 164. In an alternative embodiment, wires 162 and 164 are spaced apart such that when housing top portion 170 is joined to housing bottom portion 172, lower ridge 200 is in contact with upper ridge 192.

Housing top portion 170 and housing bottom portion 172 may be coupled together by any number of methods including, but not limited to, a tongue and groove arrangement, interference fit, snap fit, clip fit, adhesive bonding, spin welding, sonic welding, or other such methods for securely coupling the two portions together.

In one embodiment, LED lamp 100 may be firstly be inserted into LED lamp-receiving recess 190 of housing top portion 170. LED lamp 100 may be secured to top portion 170 by any number of methods including, but not limited to, pressing LED lamp 100 into housing top portion 170 to create an interference fit, with or without the use of an additional sleeve (not depicted), through the use of adhesive bonding, or other similar such methods. In such an embodiment, LED lamp 100 and top portion 170 are assembled to wires 162 and 164, and to housing bottom portion 172, causing leads 112 and 114 to pierce wires 164 and 162, respectively, as will be discussed further below.

In other embodiments, housing top portion 170 may be firstly assembled to wires 162 and 164, followed by the insertion of LED lamp 100, or housing top portion 170, LED lamp 100, and housing bottom portion 172 may be assembled in one step. Regardless of the particular assembly method, the result is that housing top and bottom portions 170 and 172 are coupled together to securely retain LED lamp 100 which pierces wires 162 and 164.

Referring to FIG. 8, a top view of LED illumination assembly 166 is depicted. In this embodiment, LED lamp 100 is centered above wires 162 and 164, while lead frame 102 is generally perpendicular to wires 162 and 164. Forward-projecting ledge 120 of lead 112 projects in a forwardly direction such that middle portion 122 and bottom portion 126 are offset in a forwardly direction from a center of LED lamp 100. Similarly, rearward-projecting ledge 140 of lead 114 projects in a rearwardly direction such that middle portion 142 and bottom portion 146 are offset in a rearwardly direction from the center of LED lamp 100.

Figure 9:
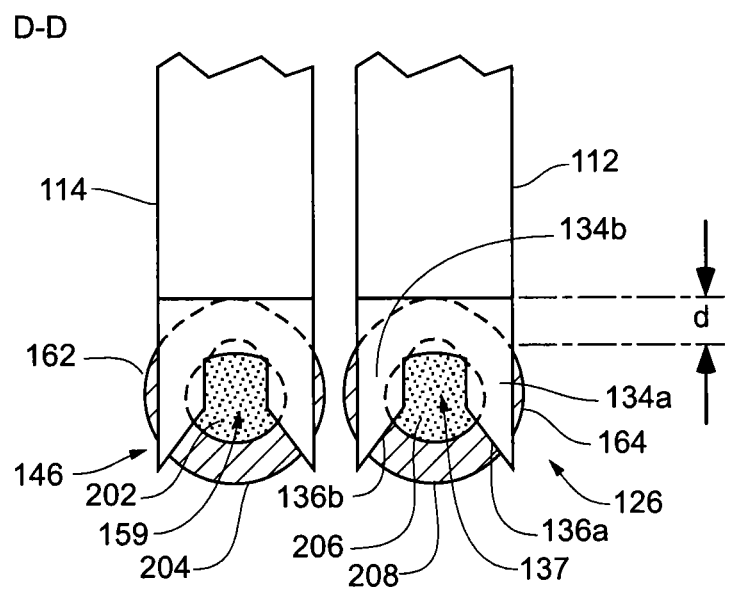
FIG. 9 is a fragmentary sectional view of the LED illumination assembly of FIG. 6, with the retention housing removed.
Figure 10:
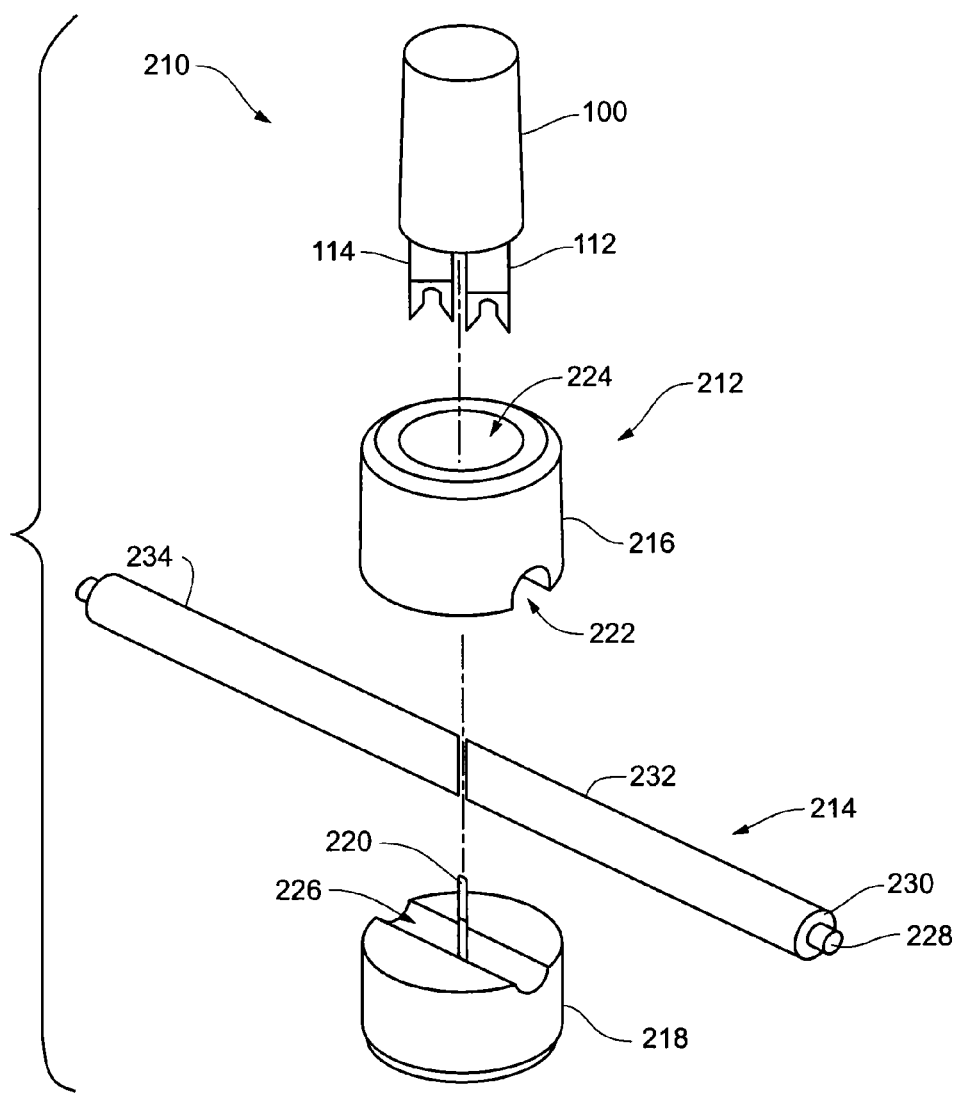
FIG. 10 is an exploded view of a single-wire LED illumination assembly according to an embodiment of the present invention.

Referring also to FIG. 9, a fragmentary sectional view of LED illumination assembly 166, with retention housing 160 removed, is depicted. The view of FIG. 9 is a sectional through lead 112 in a first plane, and a sectional through lead 114 through a second plane, depicting the interaction between lead 112 and wire 164, and between lead 114 and wire 162.

As discussed briefly above, during assembly, a downward force may be applied to lead frame 102 such that it is pressed downward onto wires 162 and 164. With respect to lead 112, cutting members 134a and 134b initially contact a top portion of wire 164 at cutting edges 136a and 136b. As lead 112 moves in a downwardly direction perpendicular to wire 164, cutting edges 136a and 136b pierce an outer surface of insulation 204, and cut through portions of insulation 204 at a top of wire 164. Wire-receiving recess 137 receives conductor 206 and may receive portions of insulation 204. As wire-receiving recess 137 receives conductor 206, some portions of conductor 206 may be channeled, or moved, along cutting edges 136a and 136b into wire-receiving recess 137, such that conductor 206 is clenched by bottom portion 126. Other portions of conductor 206 may be cut by cutting members 134a and 134b. Lead 112 stops at a final contact position as depicted in FIG. 9.

This final contact position is determined in part by the interaction of transition portion 124 and insulator 208. As discussed above, as lead 112 moves downward relative to wire 164, cutting members 134a and 134b cut through insulator 208 and portions of conductor 206. When transition portion 124 of lead 112 contacts insulator 208 at transition surface 132, bottom portion 126 generally ceases to move relative to wire 162. In other words, transition portion 124, depicted in this embodiment as a shoulder-like structure with a transition surface 132, is not capable of cutting through insulator 208, providing a counter-force and acting as a stopping mechanism.

In some embodiments, a distance from transition portion 124 to wire-receiving recess 137, distance "d", is approximately equal to, or slightly greater than a thickness of insulator 208, such that bottom portion 126 and wire-receiving recess 137 align with conductor 208 for maximum contact. It will be understood that distance d may also be greater than, or less than a thickness of conductor 208 so as to vary the alignment of bottom portion 126 and conductor 128.

For example, distance d in an alternate embodiment may be slightly greater than the thickness of insulator 208 to ensure that cutting members 134a and 134b completely pierce insulator 208 prior to stopping.

In its final contact position, lead 112 has pierced wire 164 and contacts conductor 206 at front surface 127, rear surface 129, portions of cutting edges 136a and 136b, and along a perimeter of wire-receiving recess 137. Such contact of metallic lead 112 with conductor 206 provides a reliable conductive pathway for current flowing through conductor 206 and LED lamp 100.

In substantially the same manner that lead 112 pierces wire 164, lead 114 moves downward onto wire 162, such that cutting edges 156a and 156b cut through insulator 204 and portions of conductor 202. Lead 112 comes to rest at the final contact position after transition surface 152 of transition portion 144 contacts insulator 204.

Coupling LED lamp 100 to wires 162 and 164 as described above provides a number of benefits over the prior art.

Firstly, leads 112 and 114 will consistently contact conductors 206 and 202, respectively, in a consistent and repeatable manner, providing a reliable electrical connection between LED lamp 100 and wires 162 and 164. This not only improves overall quality of any product incorporating LED lamps 100 or LED illumination assemblies 166, but also increases safety by reducing the possibility of arcing between conductors and leads.

Secondly, the cost of assembling LED lamps 100 to one or more wires 162 or 164 is significantly reduced as the time for assembly is less than that of conventional LED lamp and wire assemblies. For lighting strings employing high numbers of LED illumination assemblies 166, this time and cost savings may be extremely significant.

As described above, LED lamp 100 may be assembled into LED illumination assembly 166 having a pair of wires. When multiple assemblies 166 are assembled on a pair of wires 162 and 164, LED lamps 100 are electrically in parallel to each other. However, it may be advantageous to use multiple LED lamps 100 to form a lighting string or lighting system in which the multiple LED lamps 100 are electrically in series.

Referring to FIGS. 10-14, in an alternate embodiment, LED lamp 100 may be assembled to a single wire to form LED illumination assembly 210.

LED illumination assembly 210 includes LED lamp 100, retention housing 212, and wire 214.

Retention housing 212 is substantially similar to retention housing 160, though retention housing 212 defines a single upper groove, single lower groove, and includes a wire divider. More specifically, retention housing 212 includes housing top portion 216 and housing lower portion 218. Housing upper portion defines groove 222 and lamp receiving recess 224. Housing lower portion 218 includes wire divider 220 and defines lower groove 226.

Wire divider 220 projects generally upwards and away from housing lower portion 218 at lower groove 226. In one embodiment, wire divider 220 comprises a generally flat, panel-like structure, and is comprised of a non-conductive material such as plastic, or other similar non-conducting materials.

Wire 214 includes conductor 228 and insulator 230, and is divided into forward section 232 and rear section 234. Forward section 232 includes conductor 228a and insulator 230b; rear section 234 includes conductor 228b and insulator 230b. A length of wire 214 extends in a direction parallel to an axis F.

Figure 13:
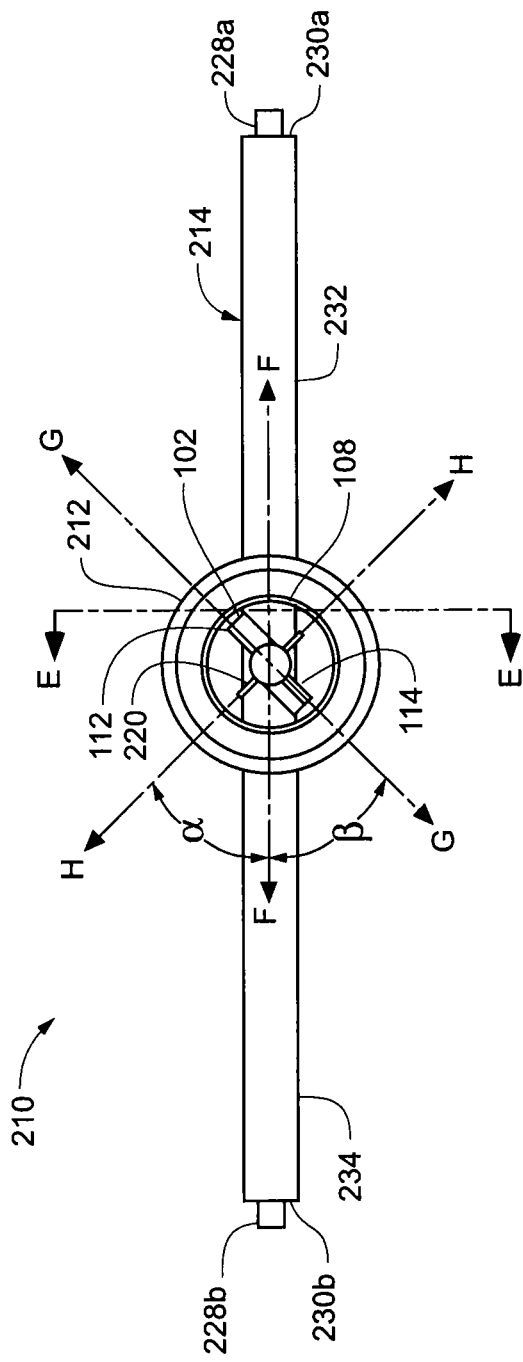
FIG. 13 is a top view of the LED illumination assembly of FIG. 10.

Referring also to FIG. 13, in the embodiment depicted, wire divider 220 may be positioned angularly to wire 214. More specifically, an axis H parallel to a length of wire divider 220 forms an angle α with axis F of wire 214. Angle α in one embodiment may be approximately 45°. In other embodiments, angle α may range from 15° to 75°.

A thickness of wire divider 220 is such that it will fit between leads 112 and 114 in gap 116. A length of wire divider 220 is such that it will span the width of wire 214 and grooves 226 and 222.

LED illumination assembly 210 is assembled in substantially the same manner as LED illumination assembly 166, with the exception of the rotation of LED lamp 100, and the piercing of wire segments 232 and 234.

LED lamp 100 is inserted into retainer housing 212 and moved downward onto wire 214. LED lamp 100 is guided into proper alignment with wire 214, in part by wire divider 220, as wire divider 220 is inserted between leads 112 and 114. Wire segments 232 and 234 are received by lower groove 226 and may be located adjacent to, or near, wire divider 220, such that lead 112 will contact wire segment 232 and lead 114 will contact wire segment 234. Wire segments 232 and 234 are not electrically connected, and remain separated by wire divider 220.

Similar to the manner discussed above with respect to LED illumination assembly 166, as LED lamp 100 is moved downward, cutting members 134a and 134b of lead 112 pierce wire segment 232. At the same time, cutting members 154a and 154b pierce wire segment 234.

When transition portions 124 and 144 respectively contact segments 232 and 234, a final contact position is reached.

Figure 11:
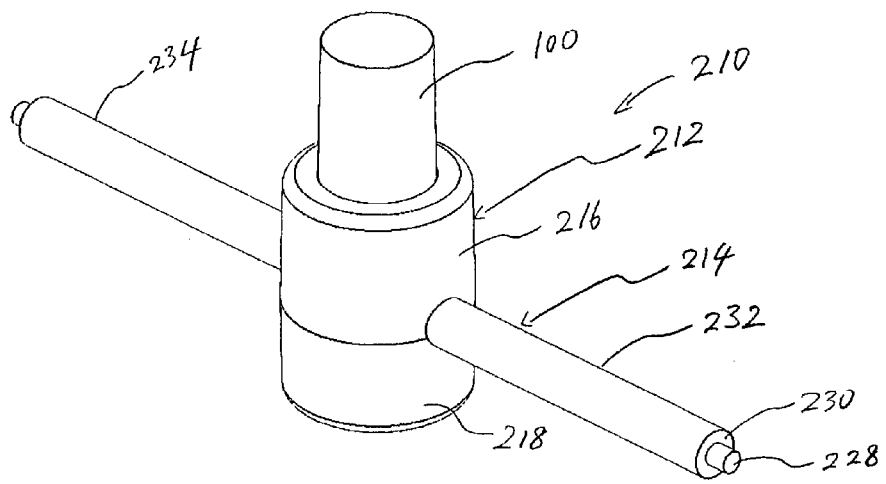
FIG. 11 is a perspective view of the assembled single-wire LED illumination assembly of FIG. 10.
Figure 12:
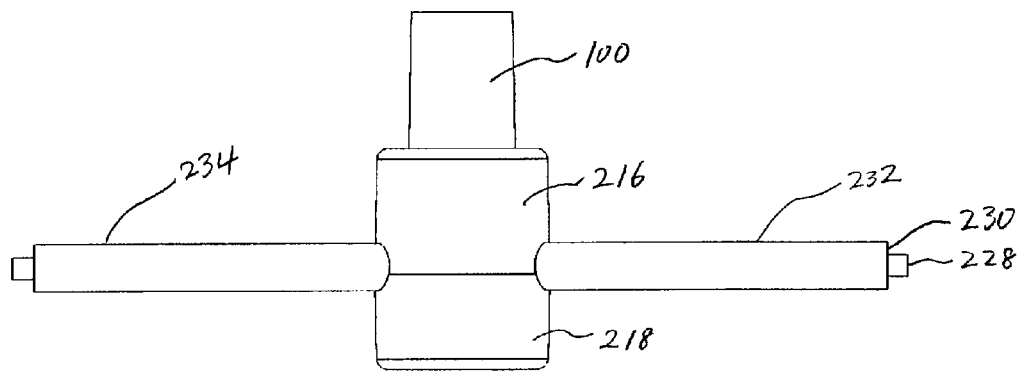
FIG. 12 is a front view of the LED illumination assembly of FIG. 10.

FIG. 11 provides a perspective view of LED illumination assembly 210, while FIG. 12 provides a side view of LED illumination assembly 210.

Figure 14:
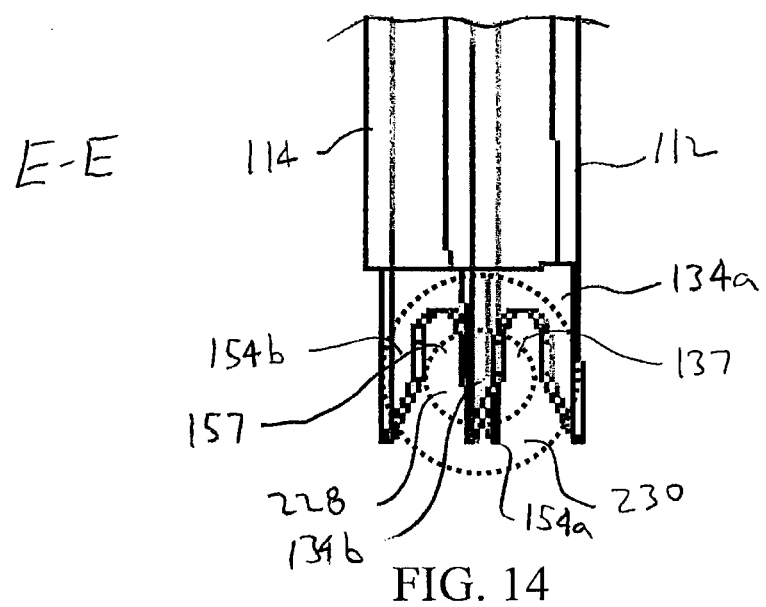
FIG. 14 is a fragmentary sectional view of the LED illumination assembly of FIG. 10, with the retention housing removed.

Referring to FIGS. 13 and 14, the final contact position of LED lamp 100 with respect to wire 214 is depicted in further detail. Lead frame 102 and its leads 112 and 114 contact wire 214 at an angle β as defined by wire axis F and lead frame 102 axis G. As depicted, in one embodiment, angle β may be approximately 45°. In other embodiments, angle β may range from 15° to 75°. When angle α and angle β are both 45°, lead frame 102 and wire divider 220 are perpendicular to each other and intersect wire 214 at approximately 45° as depicted in FIG. 13.

Referring to FIG. 14, a fragmentary, sectional view of LED illumination assembly 210 is depicted, with housing 212 removed, and wire 214 shown in phantom lines.

As depicted, leads 112 and 114 each form an approximately 45° angle with wire 214, making electrical contact with their respective wire segments 232 and 234. A right-side portion of conductor 228a of wire segment 232 is received by wire-receiving recess 137 and clasped by bottom portion 126, while a left-side portion of conductor 228b of wire segment 232 is received by wire-receiving recess 157, and clasped by bottom portion 146. Accordingly, lead 112 makes a reliable electrical contact with conductor 228a, while lead 114 makes a reliable electrical contact with conductor 228b.

In this single-wire, electrical-series embodiment, when powered, current flows through conductor 228a of wire segment 232 through lead 112 and LED chip 104, and out lead 114 and conductor 228b of wire segment 234. As such, a plurality of LED illumination assemblies 210 may be connected together to form a series-connected lighting string or system.

Figure 15:
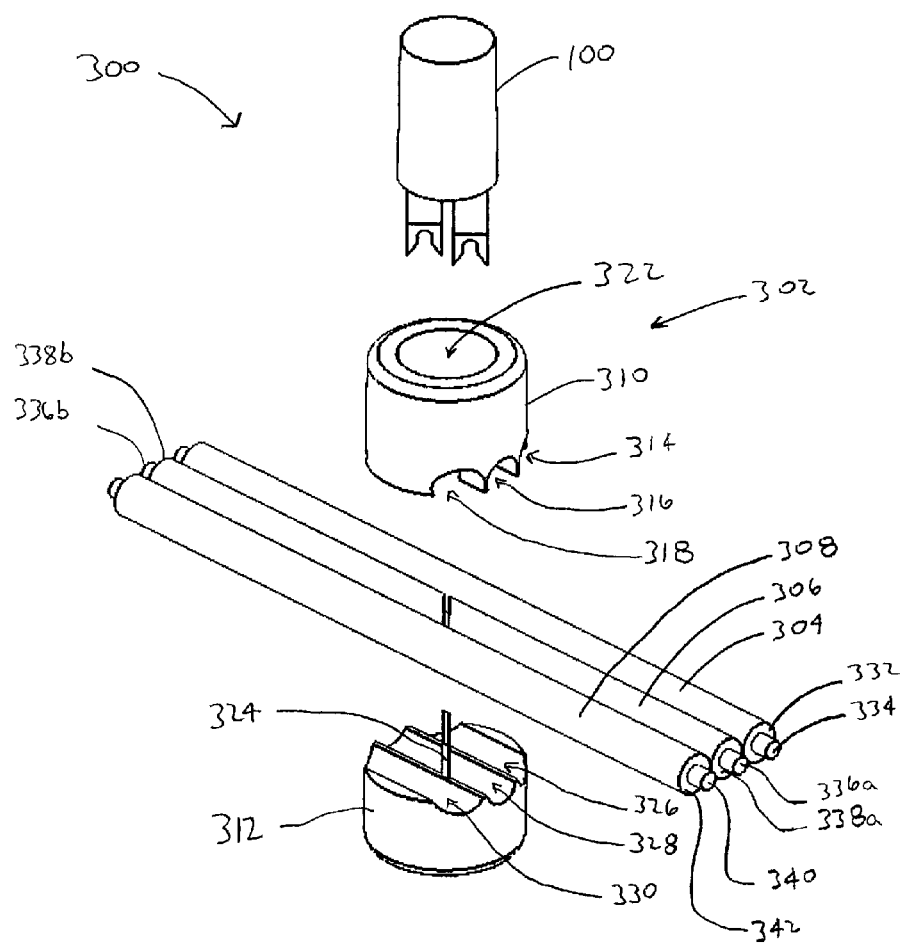
FIG. 15 is an exploded view of a three-wire LED illumination assembly according to an embodiment of the present invention.
Figure 16:
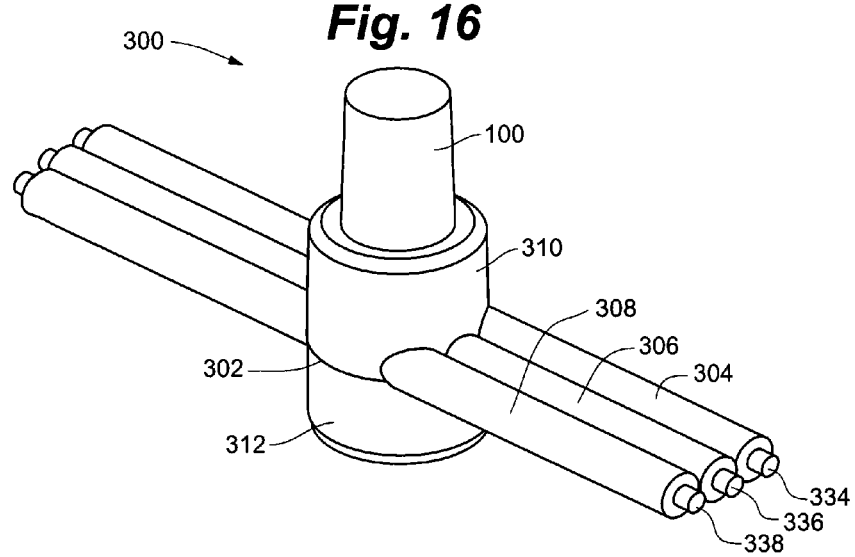
FIG. 16 is a front perspective view of the assembled three-wire LED illumination assembly of FIG. 15.
Figure 17:
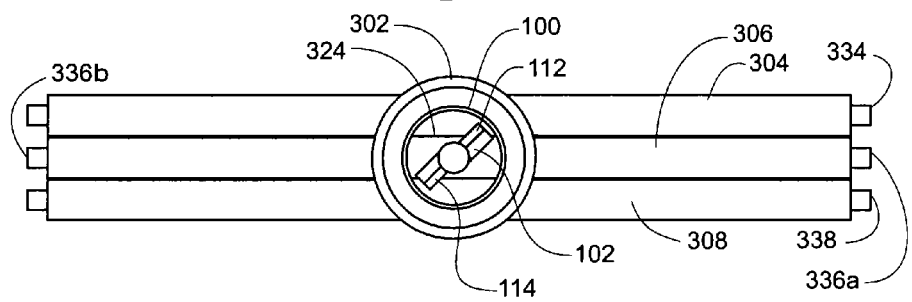
FIG. 17 is a top view of the three-wire LED illumination assembly of FIG. 16.
Figure 18:
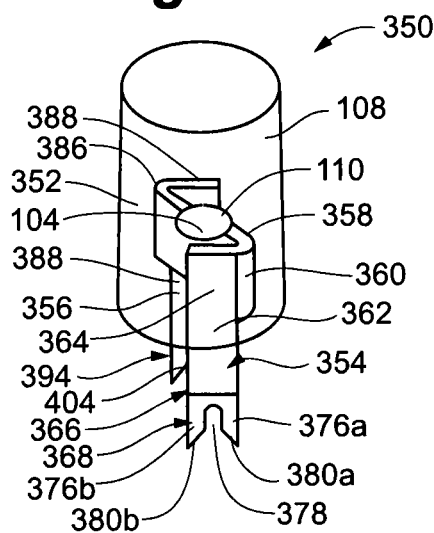
FIG. 18 is a front perspective view of an LED lamp having a Z-shaped lead frame, according to an embodiment of the present invention.
Figure 19:
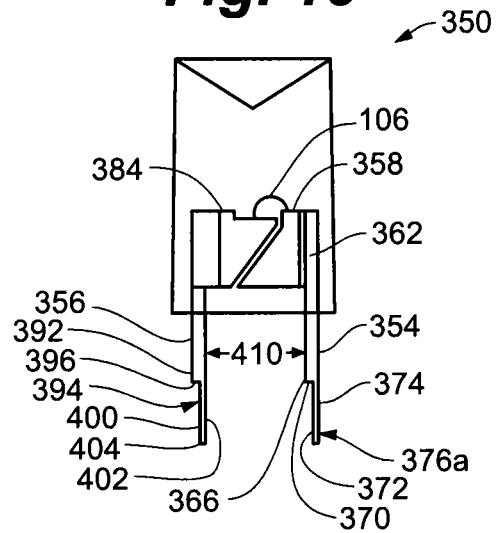
FIG. 19 is a right-side view of the LED lamp of FIG. 18.
Figure 20:
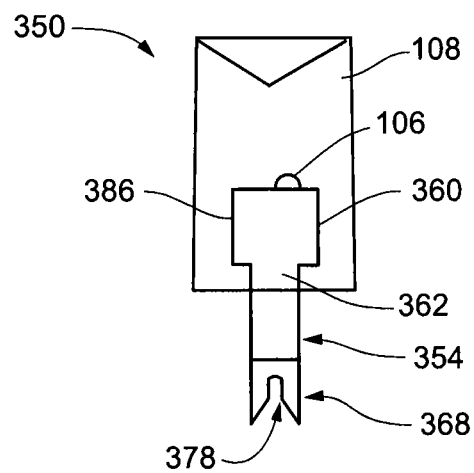
FIG. 20 is a front view of the LED lamp of FIG. 18.

Referring to FIGS. 15-17, in another embodiment, LED lamp 100 may be assembled to three wires to form an LED illumination assembly 300.

LED illumination assembly 300 includes LED lamp 100, retention housing 302, right wire 304, middle wire 306, and left wire 308.

Retention housing 302 is substantially similar to retention housings 160 and 212, though retention housing 302 defines three upper grooves, and three lower grooves, and includes a single wire divider. More specifically, retention housing 302 includes housing upper portion 310 and housing lower portion 312. Housing upper portion 310 defines right groove 314, middle groove 316, left groove 318, and lamp receiving recess 322. Housing lower portion 312 includes wire divider 324 and defines right groove 326, middle groove 328, and left groove 330.

Wire divider 324 is substantially similar to wire divider 220, and projects generally upwards and away from housing lower portion 312 at middle groove 328. In one embodiment, wire divider 324 comprises a generally flat, panel-like structure, and is comprised of a non-conductive material such as plastic, or other similar non-conducting materials.

Right wire 304 includes conductor 332 and insulator 334; middle wire 306 includes conductor 336 and insulator 338; and left wire 308 includes conductor 340 and insulator 342. Middle wire 306 is divided into forward section 344 and rear section 346.

In this triple-wire embodiment, LED illumination assembly 300, lamp 100 and lead frame 102 pierce middle wire 306 in substantially the same manner as lamp 100 and lead frame 102 pierce wire 214 in LED illumination assembly 210. Lead 112 pierces forward section 344, while lead 114 pierces rear section 416, such that a series electrical connection may be made.

As depicted, right wire 304 and left wire 308 are generally not pierced by lamp 100 or lead frame 102. In some embodiments, not depicted, lead frame 102 may incidentally pierce a portion of wires 304 and/or 308. Wires 304 and 308 may be used when a plurality of LED illumination assemblies are connected together to form a lighting string.

Referring to FIGS. 18-21, another embodiment of the present invention, LED lamp 350 with wire-piercing lead frame 352 is depicted. LED lamp 350 includes lead frame 352, LED chip 104, lead-chip connector 106, and lens 108. In some embodiments, LED lamp 350 may also include LED chip carrier 110.

Lead frame 352 includes first lead 354 and second lead 356, and similar to lead frame 102, may be comprised of any known conductive materials, including metallic materials such as aluminum, copper, bronze, tin, or similar such conductive materials.

First lead 354 includes top portion 358, connecting portion 360, and end portion 362. End portion 362 includes upper portion 364, transition portion 366, and bottom portion 368.

Top portion 358 may be substantially similar to top portion 118. Top portion 358 joins with connecting portion 360, which in turns joins end portion 362. Connecting portion may be generally curved as depicted, but in other embodiments may form a corner or other connection structure. End portion 362 extends perpendicularly and downwardly away from connecting portion 362.

Upper portion 364 of end portion 362 may be generally rectangular as depicted, though in other embodiments may be cylindrical, or comprise other shapes. Transition portion 366 is substantially similar to transition portion 124, and includes surface 370. Bottom portion 368 may be substantially similar to bottom portion 126, and includes front surface 372, rear surface 374, and cutting members 376a and 376b. Bottom portion 368 defines conductor receiving recess 378. Cutting members 376a and 376b include cutting edges 380a and 380b, respectively.

Second lead 382 includes top portion 384, connecting portion 386, and end portion 388. End portion 388 includes upper portion 390, transition portion 392, and bottom portion 394.

Top portion 384 may be substantially similar to top portion 138. Top portion 384 joins with connecting portion 386, which in turns joins end portion 388. End portion 388 extends perpendicularly and downwardly away from connecting portion 386. Upper portion 390 of end portion 362 may be generally rectangular as depicted, though in other embodiments may be cylindrical, or comprise other shapes. Transition portion 392 may be substantially similar to transition portion 144, and includes surface 396. Bottom portion 394 may be substantially similar to bottom portion 146, and includes front surface 400, rear surface 402, and cutting members 404a and 404b. Bottom portion 394 defines conductor receiving recess 406. Cutting members 404a and 404b include cutting edges 408a and 408b, respectively.

Figure 21:
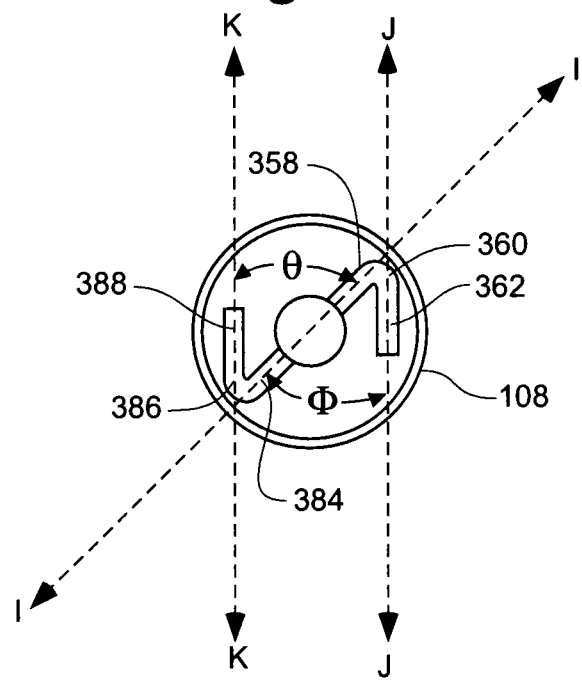
FIG. 21 is a top view of the LED lamp of FIG. 18.

Referring specifically to FIG. 21, as depicted in a top view of LED lamp 350, in this embodiment, lead frame 352 forms a "Z" or backward "Z" shape, with top portion 358 having a longitudinal axis I forming an angle$\theta$ with end portion 362 having a longitudinal axis J. In the embodiment depicted, angle$\theta$ is approximately 45°. However, in other embodiments, angle $\theta$ may range from 0° to 360°. Modifying angle$\theta$ determines, in part, an angle at which bottom portion 394 pierces a wire, as discussed further below.

Similarly, top portion 384 sharing the longitudinal axis I forms an angle $\Phi$ with end portion 388 having a longitudinal axis K. In the embodiment depicted, angle $\Phi$ is approximately 45°. However, in other embodiments, angle $\Phi$ may range from 0° to 360°. Further, angle $\Phi$ may be different in magnitude than angle $\theta$.

Leads 352 and 354 are separated by a distance 410 which may vary depending on wire size and other application-specific factors. Lamp 350 with lead frame 252 may be combined with one or a plurality of wires to form, for example, a single, double, or triple wire LED illumination assembly.

Figure 22:
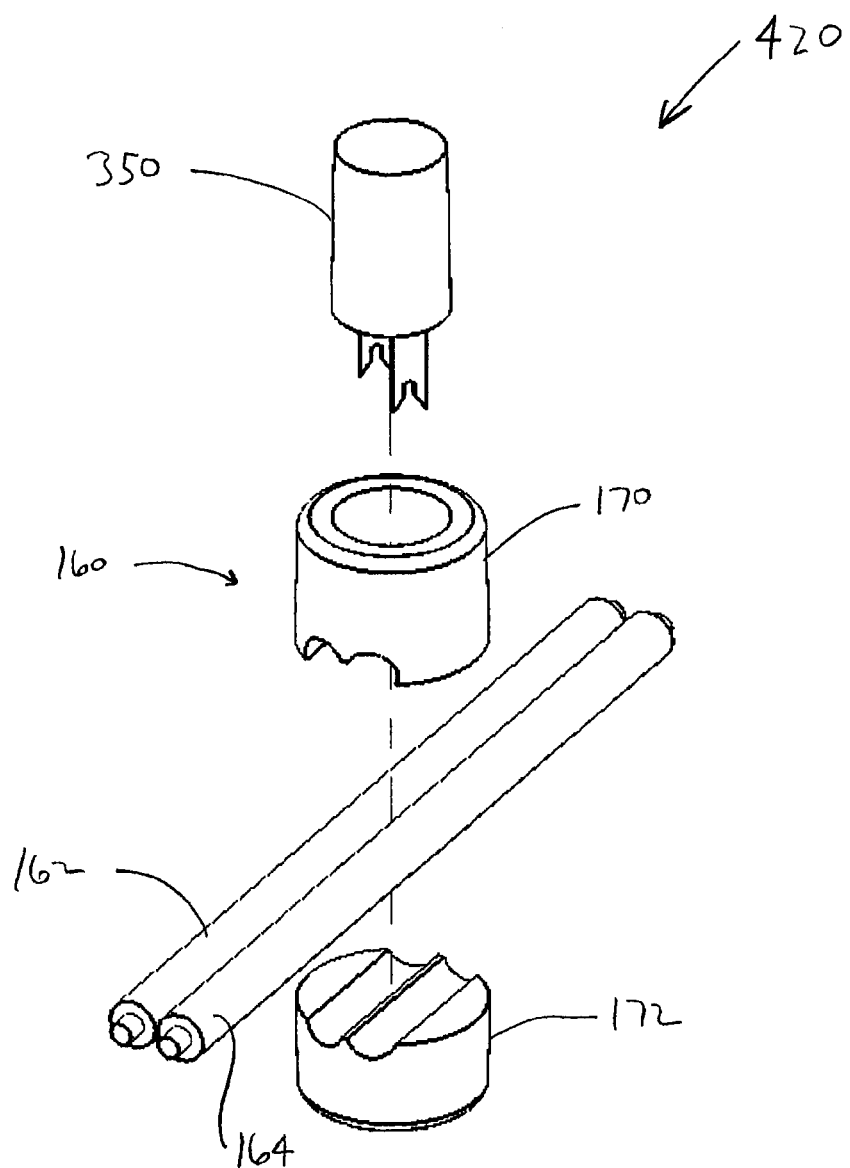
FIG. 22 is an exploded perspective view of a two-wire LED illumination assembly including the LED lamp of FIG. 18, according to an embodiment of the present invention.
Figure 23:
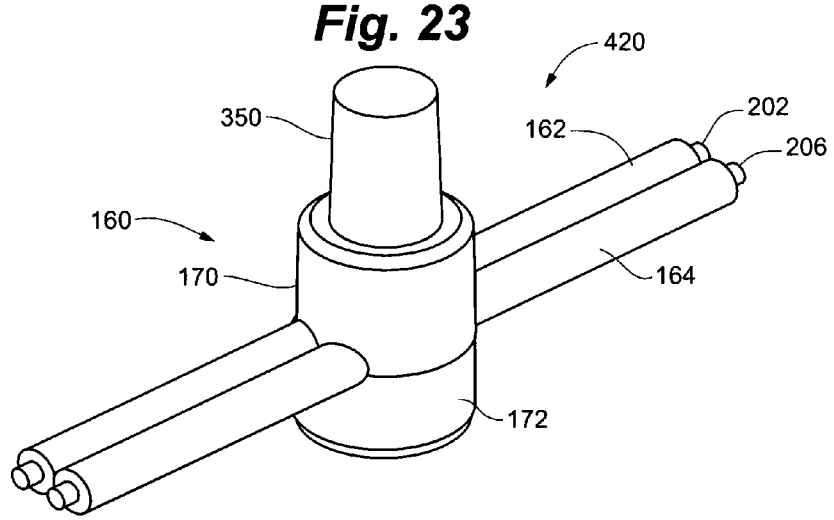
FIG. 23 is a front perspective view of the assembled two-wire LED illumination assembly of FIG. 22.
Figure 24:
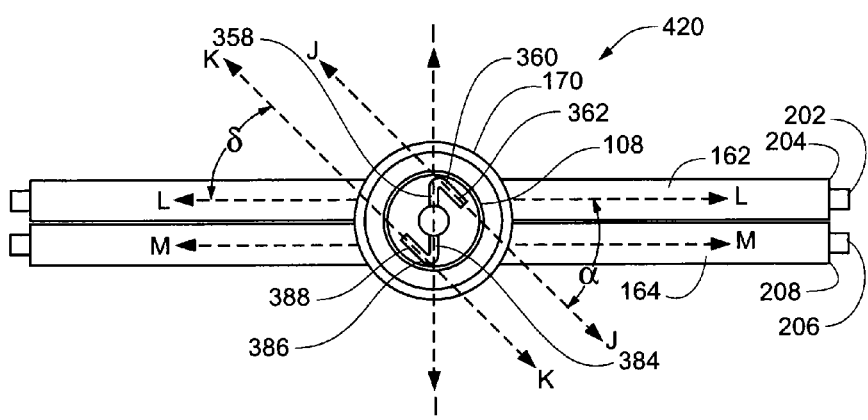
FIG. 24 is a top view of the two-wire LED illumination assembly of FIG. 23.

Referring to FIGS. 22-24, a double-wire or parallel configuration, LED illumination assembly 420 that includes lamp 350 with lead frame 252 is depicted. LED illumination assembly 420 is similar to LED illumination assembly 166 in configuration, with the exception of the inclusion of a different lamp 350, which pierces wires 162 and 164 in a somewhat different manner.

Referring specifically to FIG. 24, when assembled, lead frame 352 top portions 358 and 384 substantially form right angles with wires 162 and 164, respectively. More specifically, axis I of top portions 358 and 384 forms a right angle with axes L and M of wires 162 and 164.

Unlike LED illumination assembly 166, in this embodiment, namely LED illumination assembly 420, leads 354 and 356 pierce wires 162 and 164, respectively, at angles other than 90°. As depicted, axis J of top portion 362 forms angle $\gamma$ with axis L of wire 162, and axis K of top portion 388 forms angle $\delta$ with axis M of wire 164. In the depicted embodiment, angle $\gamma$ and angle $\delta$ are substantially equal, and are each substantially 45°. In other embodiments, angles $\gamma$ and $\delta$ may not be equal, and may be greater than or less than 45°. Therefore, bottom portions 368 and 394 pierce wires 162 and 164 at angles $\gamma$ and $\delta$, or 45° in this embodiment. Cutting members 376 and 404 cut through insulators 204 and 208, respectively, clasping conductors 202 and 208, thereby forming an electrical connection between lead 354 and conductor 202, and between lead 356 and conductor 206.

Figure 25:
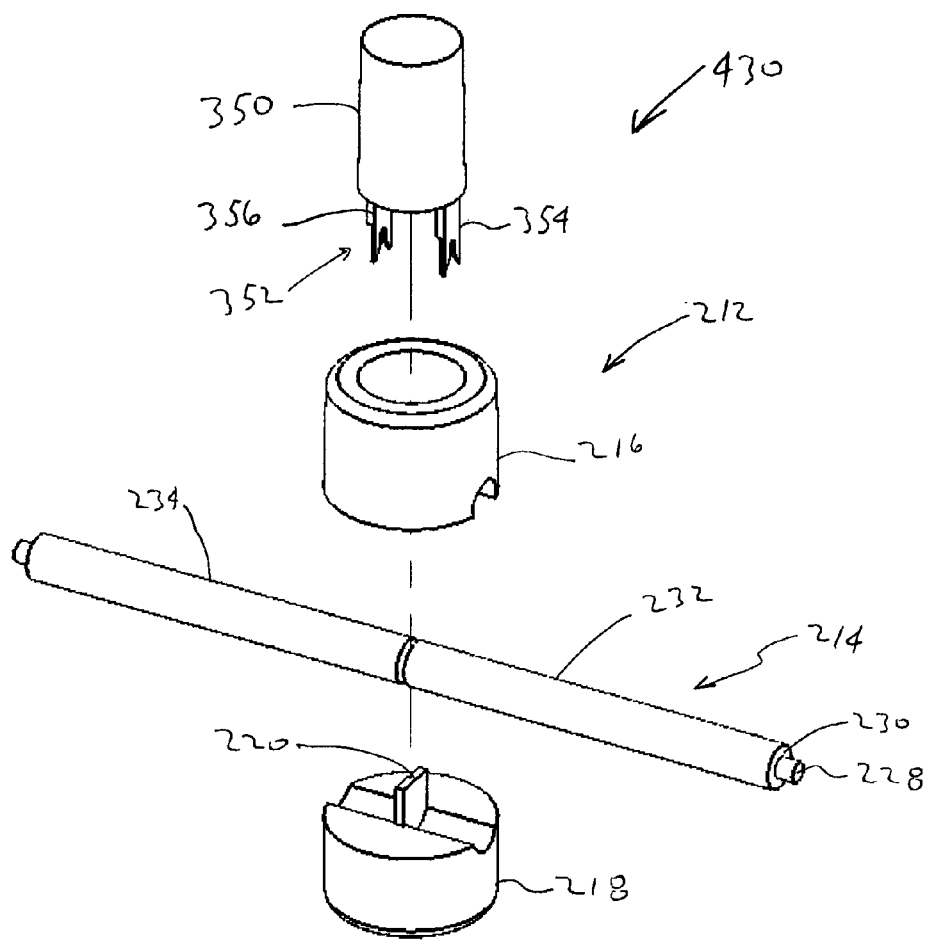
FIG. 25 is an exploded perspective view of a single-wire LED illumination assembly including the LED lamp of FIG. 18, according to an embodiment of the present invention.
Figure 26:
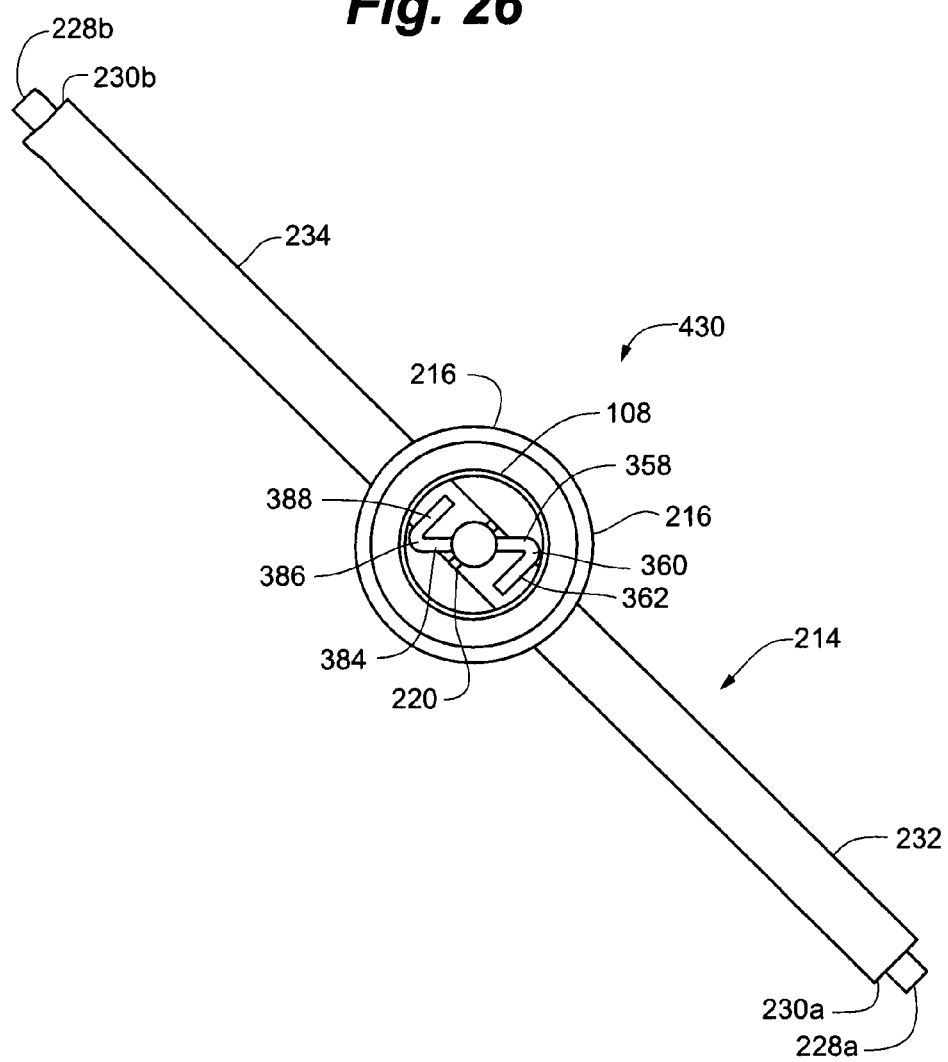
FIG. 26 is a top view of the assembled single-wire LED illumination assembly of FIG. 25.

Referring to FIGS. 25 and 26, a single-wire or series configuration, LED illumination assembly 430 that includes lamp 350 with lead frame 252 is depicted. In this embodiment, LED illumination assembly 430 includes lamp 350, retaining housing 212, and wire 214. LED illumination assembly 430 is similar to LED illumination assembly 210, with the exception of lamp 350 and lead frame 352, and the angle at which lead frame 352 interacts with wire 214.

Referring specifically to FIG. 26, in this embodiment, lamp 350, and therefore lead frame 352, are oriented such that top portions 358 and 384 each form a substantially 45° angle with wire 214, while end portions 362 and 368 form substantially 90° degree angles with wire 214. As assembled, cutting members 376 and 404 cut through wire portions 232 and 234, respectively, clasping conductors 228a and 228b, thereby forming an electrical connection between lead 354 and conductor 228a, and between lead 356 and conductor 228b. One advantage of this embodiment is that because cutting members 376 and 404 cut through wire portions 232 and 234 at right angles, a greater cross-sectional area of conductors 228a and 228b are in contact with leads 354 and 356, thus potentially improving the electrical connection between lamp 350 and wire 214.

Figure 27:
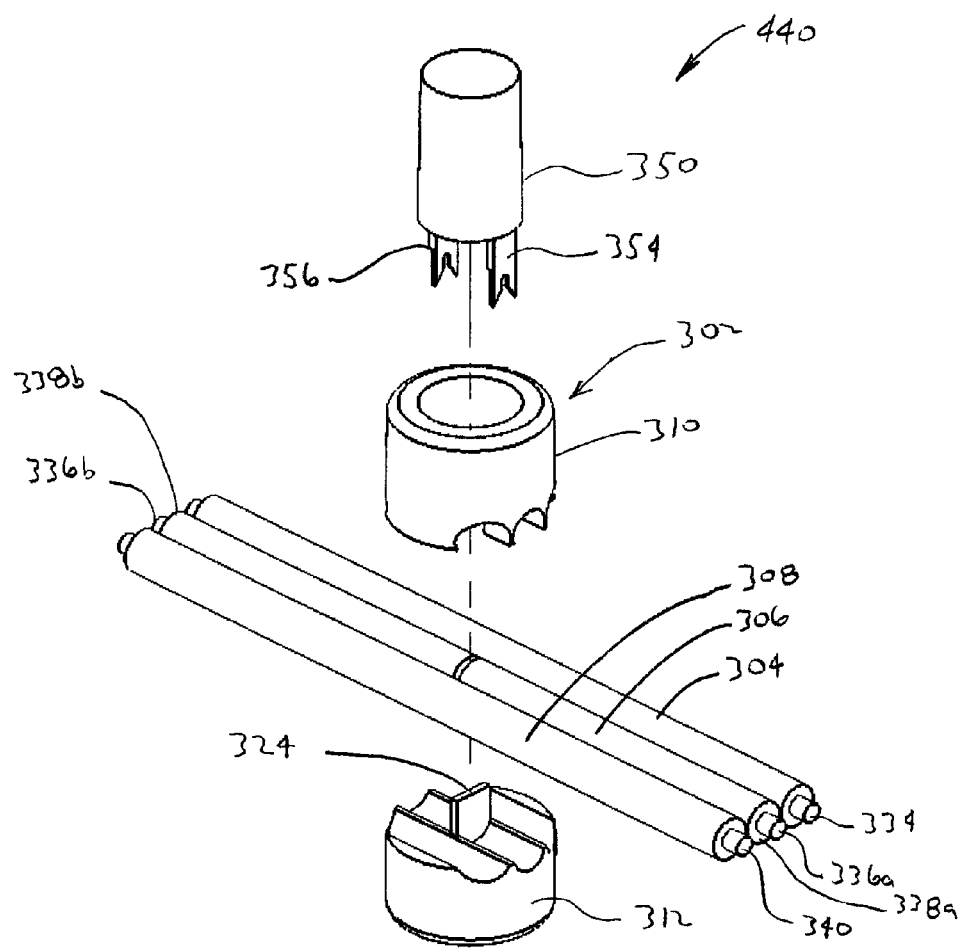
FIG. 27 is an exploded view of a three-wire LED illumination assembly including an LED lamp of FIG. 18, according to an embodiment of the present invention.
Figure 28:
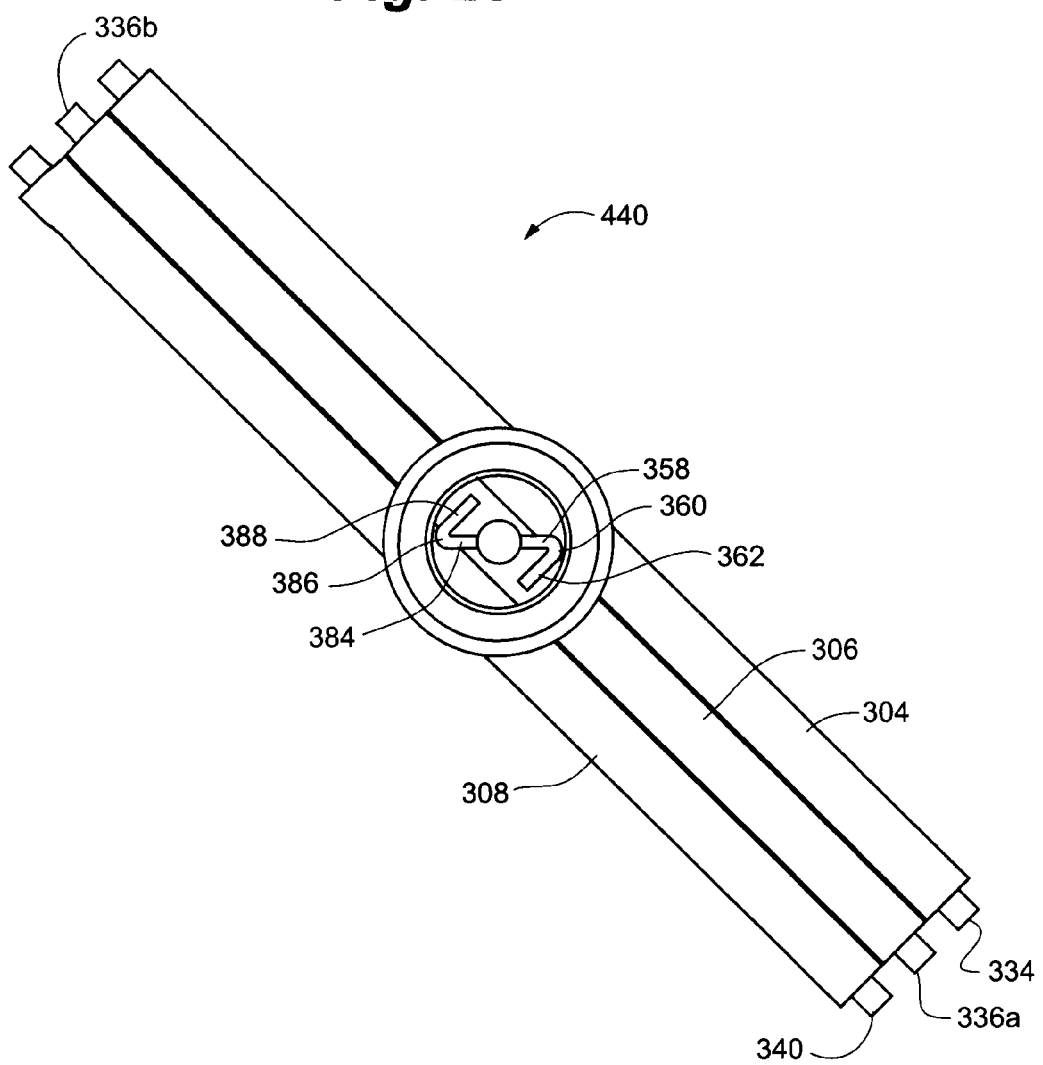
FIG. 28 is a top view of the assembled three-wire LED illumination assembly of FIG. 27.

Referring to FIGS. 27 and 28, a triple-wire configuration LED illumination assembly 440 that includes lamp 350 with lead frame 252 is depicted. LED illumination assembly 440 is similar to triple-wire LED illumination assembly 300 described above, with the exception of the inclusion of lamp 350 and lead frame 352, rather than lamp 100 and lead frame 102.

LED illumination assembly 440 includes lamp 350, retaining housing 302, and wires 304, 306, and 308. When assembled, LED illumination assembly 440 creates an electrical connection between lead 354 and conductor 338a, and between lead 356 and conductor 338b, in substantially the same manner as LED illumination assembly 430 creates an electrical connection between lead frame 352 and wire 214.

Figure 29:
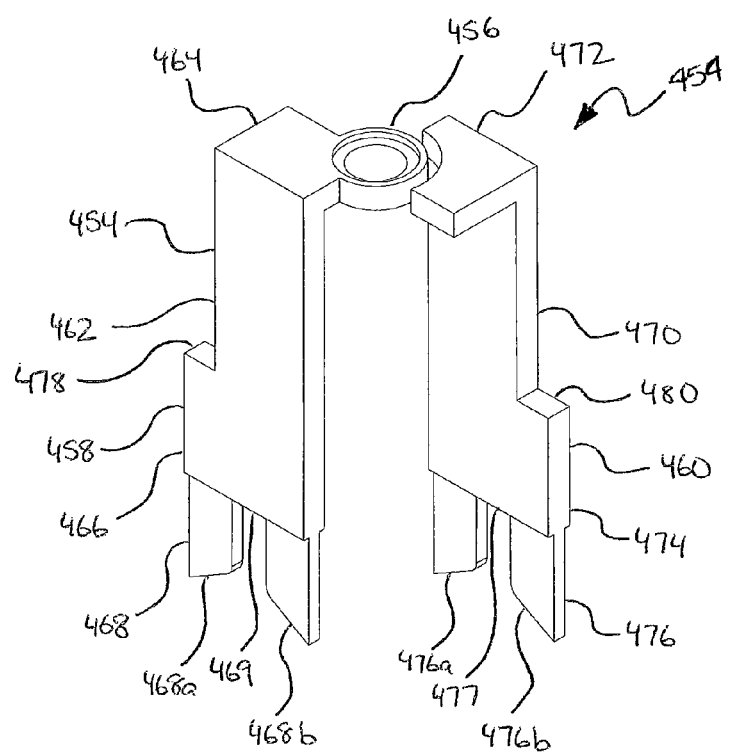
FIG. 29 is a front perspective view of another LED lead frame, according to an embodiment of the present invention.
Figure 30:
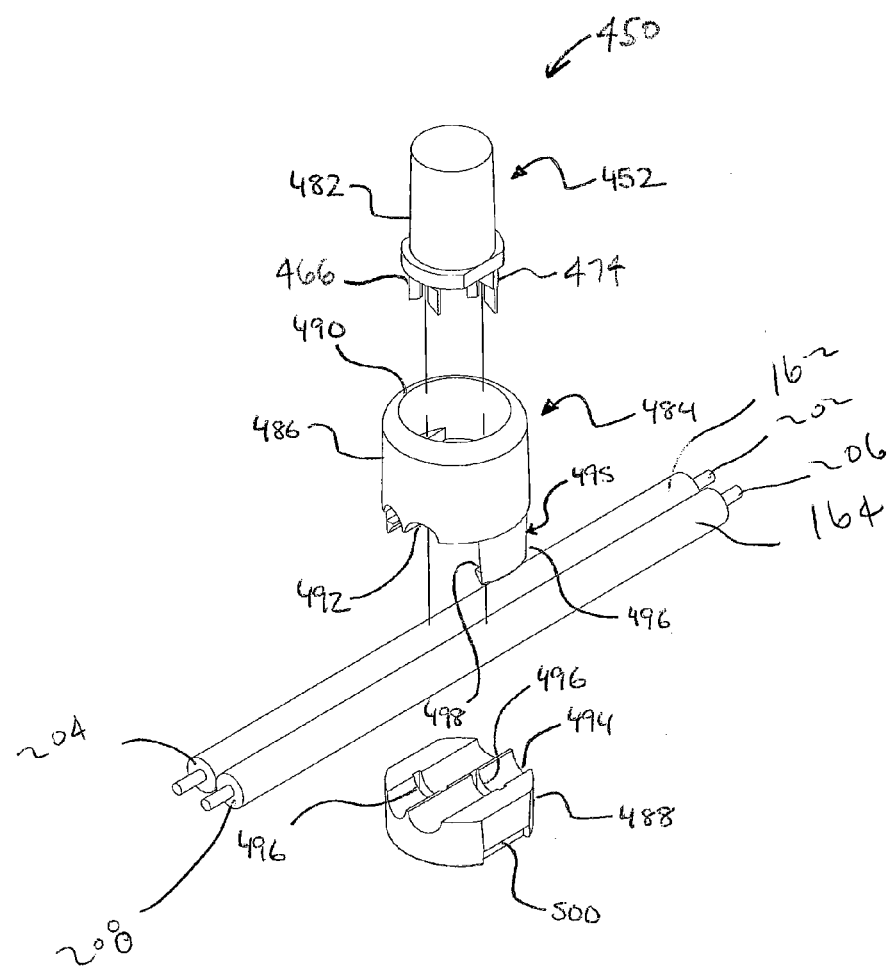
FIG. 30 is a front perspective, exploded view of a two-wire LED illumination assembly including the LED lead frame of FIG. 29, according to an embodiment of the present invention.
Figure 31:
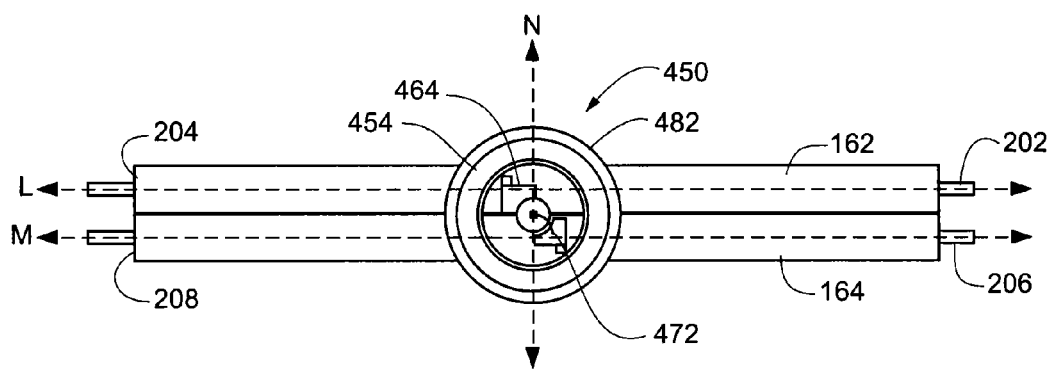
FIG. 31 is a top view of the two-wire LED illumination assembly of FIG. 30.

Referring to FIGS. 29 to 31, a double wire or parallel configuration, LED illumination assembly 450 that includes lamp 452 with lead frame 454 is depicted. LED illumination assembly 450 is similar to LED illumination assembly 420 in configuration, with the exception of the inclusion of a different lamp 452, which pierces wires 162 and 164 in a somewhat different matter.

Referring to FIG. 29, as with lamp 350, lamp 452 comprises a lead frame 454 having a chip carrier 456, a first lead 458 and a second lead 460. First lead 458 includes a lead body 462 having a top portion 464 and an end portion 466 having a first cutting member 468. Second lead 460 includes a lead body 470 having a top portion 472 and an end portion 474 having a second cutting member 476. As with lamp 350, first and second leads 458, 460 are operably linked to chip carrier 456 such that lead bodies 462, 470 extend in a generally downward direction from the chip carrier 456. Lead bodies 462, 470 comprise generally planar shapes, wherein top portions 464, 472 of each lead body 462, 470 is perpendicular to the rest of lead body 462, 470. First cutting member 468 further comprises a first cutting blade 468a and a second cutting blade 468b.

First and second cutting blade 468a, 468b define a notch 469 between blades 468a, 468b such that blades 468a, 468b may cut through the insulation 204, 208 of the wires 162, 164 and contact the conducting portion of the wires 202, 206. In some embodiments, no portion the conducting portion of the wires 202, 206 are severed, in other embodiments, some portion of the conducting portion of the wire is severed, though in any case, leads 458, 460 make electrical contact with the conduction portion of their respective wires. According to an embodiment of the present invention, notch 469 can comprise a rounded shape conforming to the circular cross-section of the conducting portion of the wire. Second cutting member 476 also further comprises a first cutting blade 476a and a second cutting blade 476b defining a notch 477 and arranged in the same manner as first cutting member 468.

Referring also to FIG. 30, lamp 452 can further comprise a lens 482 covering chip carrier 456, an LED chip, and a portion of lead bodies 462, 470 such that end portions 466, 474 of lead bodies 462, 470 protrude from lens 482. Lead bodies 462, 470 cooperatively support lens 482 to position the lens 482 over chip carrier 456.

Referring also to FIG. 31, when engaging wires 162 and 164, lead bodies 462, 470 of lead frame 454 substantially form right angles with wires 162 and 164, respectively. More specifically, axis N of top portions 464, 472 form right angles with axes L and M of wires 162, 164.

Unlike LED illumination assembly 420, in lamp 452, leads 458, 460 pierce wires 162 and 164, respectively, at right angles similar to LED illumination assembly 166. However, unlike LED illumination assembly 166, first end portion 464 and second end portion 474 a first shoulder 478 and a second shoulder 480, respectively, extending outwardly from leads 468, 468 along axis N. Shoulders 478, 480 allow blades 468a, 468b, 476a, 476b of cutting members 468, 476 to be spaced further apart to accommodate larger gauge wire without increasing the footprint of the top portions 464, 472 of leads 458, 460. By maintaining the footprint of the top portions 464, 472 lead frame 454 can accommodate the same size lens 482 despite the increased wire gauge. Shoulders 478, 480 can also provide a supporting surface for lens 482 to position lens 482 over chip carrier 456.

Figure 32:
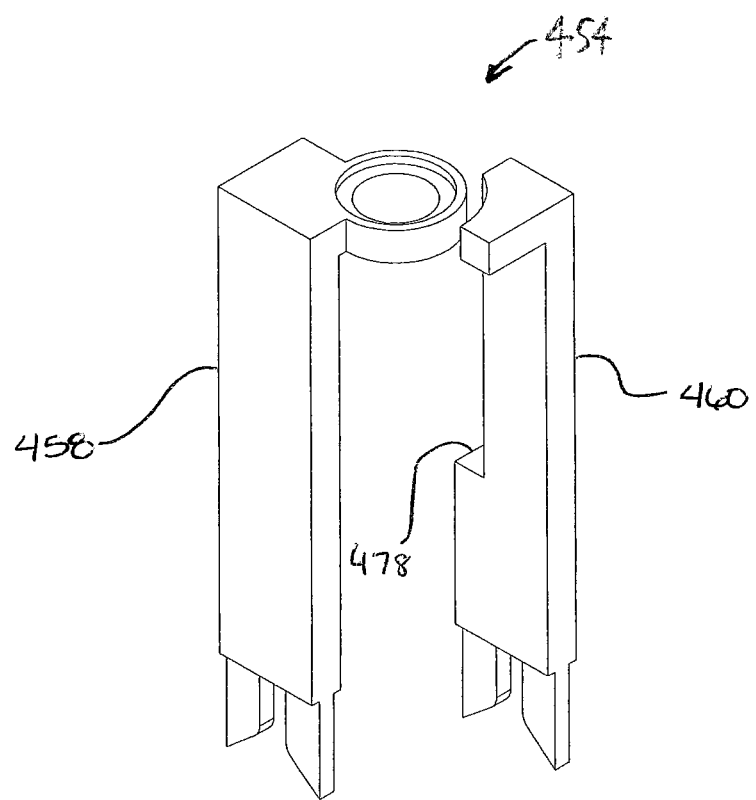
FIG. 32 is a front perspective view of yet another LED lead frame, according to an embodiment of the present invention.

As shown in FIG. 32, an alternate embodiment of lead frame 454 is depicted. In this alternative embodiment, either first lead 458 or second lead 460 can comprise a shoulder 478, 480 while in some embodiments, the opposite lead 458, 460 does not have shoulder 478, 480. Such an embodiment may be used in LED lamp 452 and LED illumination assembly 450.

Referring again to FIGS. 30 to 31, LED illumination assembly 450 may further comprise a retainer housing 484. Retainer housing 484 can further comprise a housing top portion 486 and a housing bottom portion 488. Housing top portion 486 defines a recess 490 for receiving LED lamp 452 and at least one groove 492 for receiving a wire. Housing bottom portion 488 further comprises at least one groove 494 completing the groove 492 of top portion 486 and at least two slots 496 for receiving a portion of either blade member 468, 476.

As shown in FIG. 30, housing top portion 486 and housing bottom portion 488 can be interlocked around wires 162, 164 such that wires 162, 164 are received within grooves 492, 494. LED lamp 452 is insertable through recess 490, which guides LED lamp 452 as it engages wires 162, 164 and retains LED lamp 452 after LED lamp 452 is connected to the wires 162, 164.

According to an embodiment of the present invention, housing top portion 486 can further comprise a locking assembly 495 having locking arms 496 extending from the bottom of the housing top portion 486 and having tabs 498 for engaging the housing bottom portion 488. Correspondingly, the housing bottom portion 488 can also define a shoulder 500 for operably engaging the tabs 498 of the housing top portion 486 to lock the housing top portion 486 and bottom portion 488 together.

Figure 33:
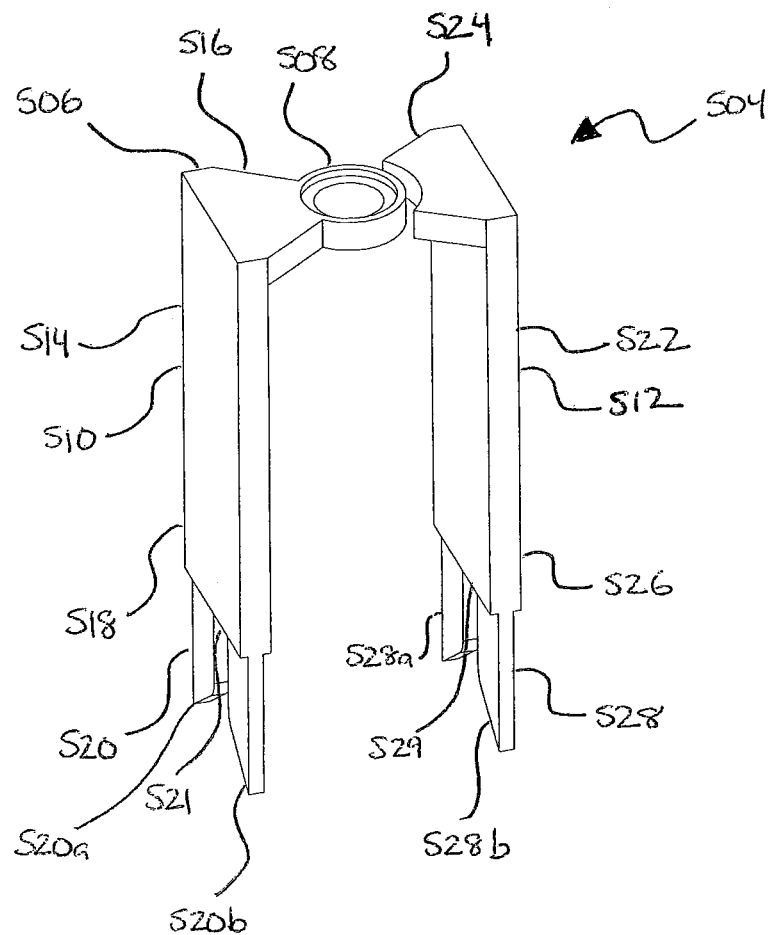
FIG. 33 is a front perspective view of another LED lead frame, according to an embodiment of the present invention.
Figure 34:
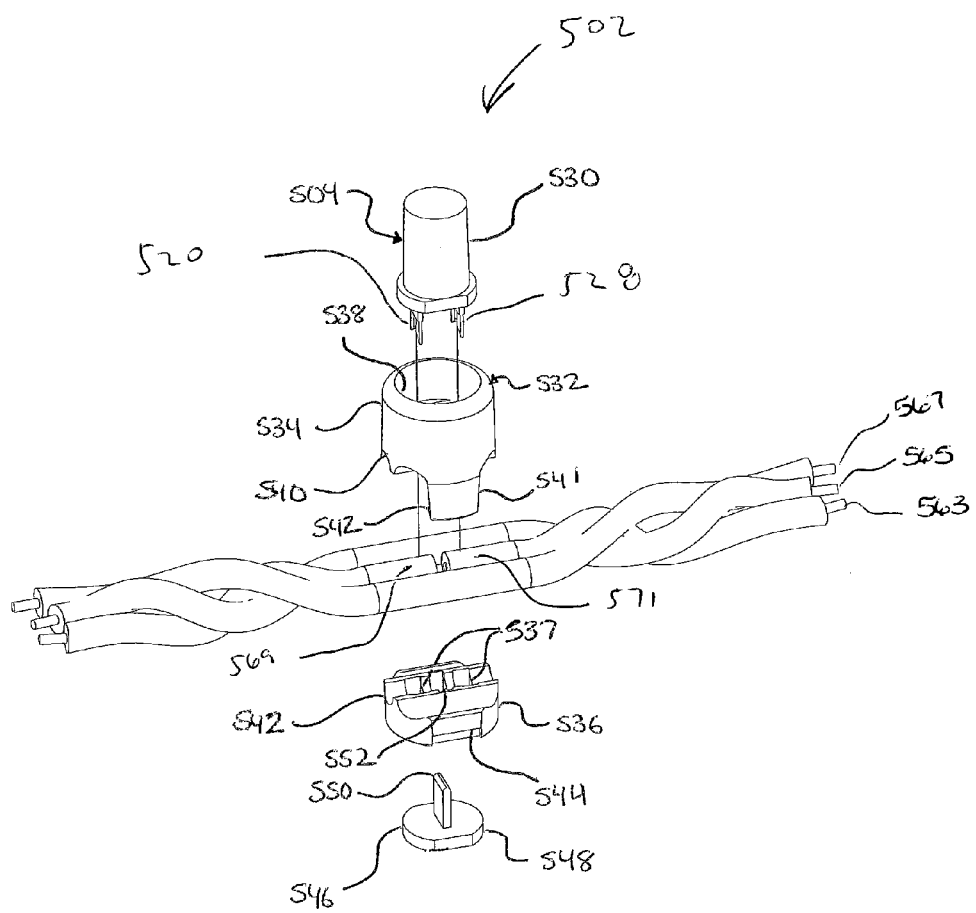
FIG. 34 is a front perspective view of another three-wire LED illumination assembly, according to an embodiment of the present invention.

Referring to FIGS. 33 to 34, a single or triple wire configuration LED illumination assembly 502 that includes a lamp 504 with lead frame 506 is depicted. LED illumination assembly 502 is similar to LED illumination assembly 420 in configuration; with the exception that lamp 504 is adapted to pierce only a single wire 563 in either a single or triple wire configuration.

Referring to FIG. 33, as with lamp 452, lamp 504 comprises a lead frame 506 having a chip carrier 508, a first lead 510 and a second lead 512. First lead 510 includes a lead body 514 comprising a top portion 516 and an end portion 518 having a first cutting member 520. Second lead 512 includes a lead body 522 having a top portion 524 and an end portion 526 having a second cutting member 528. As with lamp 452, first and second leads 510, 512 are operably linked to chip carrier 508 such that lead bodies 514, 522 extend generally downwardly from chip carrier 508. Lead bodies 514, 522 comprise generally planar shapes, wherein top portions 516, 524 of each lead body 514, 522 is perpendicular to the rest of lead body 514, 522. First cutting member 520 further comprises a first cutting blade 520a and a second cutting blade 520b.

First and second cutting blade 520a, 520b define a notch 521 between blades 520a, 520b such that blades 520a, 520b may cut through the insulation of the wire and contact the conducting portion of the wire 563. In some embodiments, the conducting portion of the wire is not severed, in other embodiments, a portion of the conducting portion of the wire is severed, though in any case, leads 458, 460 make electrical contact with the conduction portion of their respective wires. According to an embodiment of the present invention, notch 521 can comprise a rounded shape conforming to the circular cross-section of the conduction portion of the wire. In other embodiments, second cutting member 528 also further comprises a first cutting blade 528a and a second cutting blade 528b defining a notch 529 and arranged in the same manner as first cutting member 520.

Lamp 504 can further comprise a lens 530 covering chip carrier 508 and a portion of lead bodies 514, 522 such that end portions 518, 526 of lead bodies 514, 522 protrude from lens 530. Lead bodies 514, 522 cooperatively support lens 530 to position lens 530 over chip carrier 508.

Unlike LED lamp 452, cutting members 520, 528 of lamp 504 are aligned to pierce only a single wire 563 at an angle perpendicular to wire 563 in contrast to lamp 452 where cutting members 468, 476 are offset to pierce two different wires 162, 164 at an angle perpendicular to both wires 162, 164.

As depicted in FIG. 34, first and second leads 510, 512 are adapted to pierce wire 563 on opposite sides of a gap in wire 230, 336 such that lamp 504 is connected to wire 563 in series by acting as a bridge across the gap.

Similar to LED illumination assembly 450, LED illumination assembly 502 can further comprise a retainer housing 532. Retainer housing 532 can further comprise a housing top portion 534 and a housing bottom portion 536. Housing top portion 534 defines a recess 538 for receiving LED lamp 504 and defines a groove 540. Housing bottom portion 536 further comprises a groove 542 completing groove 540 of top portion 534 and at least two blade slots 537 for receiving a portion of either blade member 520, 528.

According to an embodiment of the present invention, retainer housing 532 can also comprise a locking assembly 538 similar to locking assembly 495 and having locking arms 541 extending from the bottom of housing top portion 534 and having tabs 542 for engaging housing bottom portion 536. Correspondingly, housing bottom portion 536 can also define a shoulder 544 for operably engaging tabs 542 of housing top portion 534 to lock housing top portion 534 and housing bottom portion 536 together.

As shown in FIG. 34, housing top portion 534 and housing bottom portion 536 are interlocked around the gap in the wire such that inserting LED lamp 504 into recess 538 pierces cutting members 520, 528 into ends of wire 569, 571 on opposite sides of the gap.

However, unlike retention housing 484 in LED illumination assembly 450, retention housing 532 further comprises a divider cap 546 insertable into retention housing 532 opposite LED lamp 504 according to an embodiment of the present invention. Divider cap 546 comprises a cap body 548 and a wire divider 550. In this configuration, housing bottom portion 536 further comprises a divider slot 552 positioned proximate to the gap in wire 230, 336. As shown in FIG. 34, wire divider 550 is inserted through divider slot 552 and positioned within the gap between the ends of wire 563 to prevent the ends 569, 571 of wire 563 from contacting each other and shorting out LED lamp 504. According to an embodiment of the present invention, wire divider 550 can also comprise a blade member 551 for severing the wire to form the gap.

As depicted, wire 563 may be a single wire of a triple-wire arrangement comprised of wires 563, 565, and 567, or may be a stand-alone, single wire 563. Further, a triple-wire arrangement may be a twisted configuration as depicted, a triple-parallel arrangement, or otherwise. As such, retainer housing 532 will fit over and retain lamp 504 to wires 563, 565, and 567.

Figure 35:
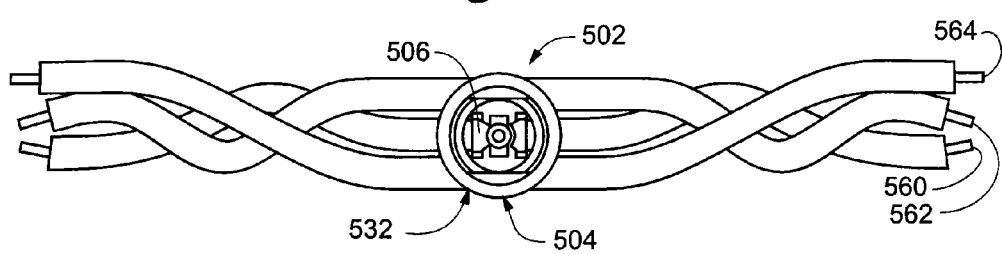
FIG. 35 is a top view of the three-wire LED illumination assembly of FIG. 34.

Referring to FIG. 35, a top view of assembly 502, is depicted. Lamp 504 is retained onto wires 563, 565, and 567 by retainer housing 532, while LED lead frame 506 is generally parallel to, and piercing, wire 565.

Figure 36:
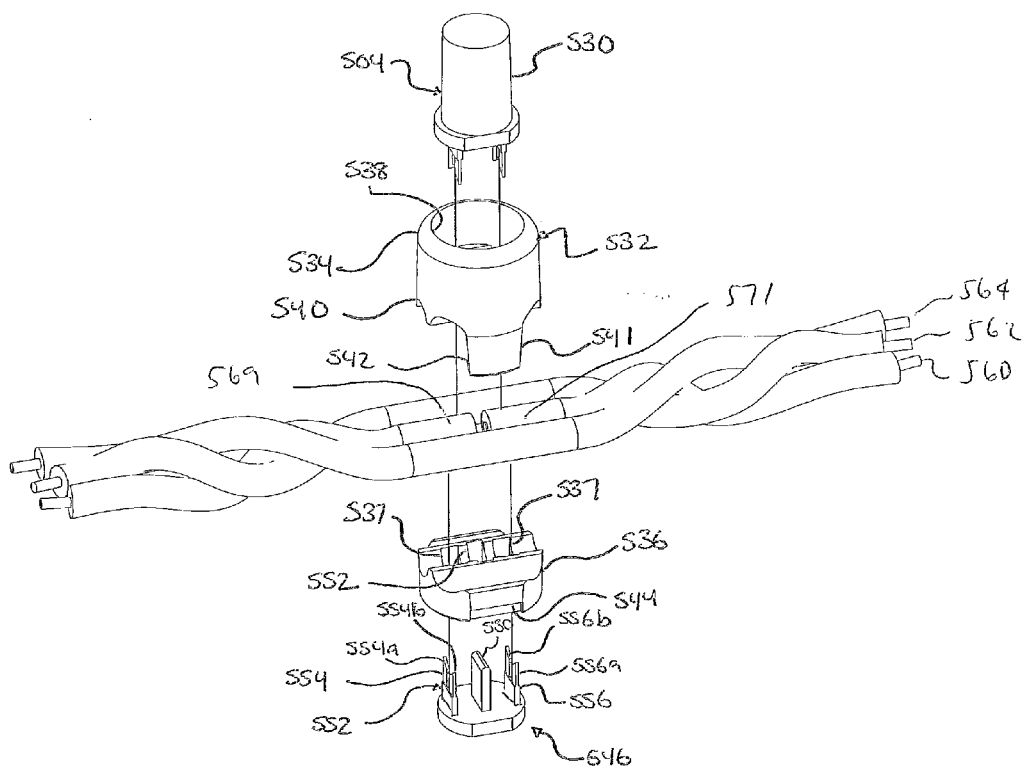
FIG. 36 is a front perspective, exploded view of a three-wire LED illumination assembly having a bypass arrangement, according to an embodiment of the present invention.
Figure 37:
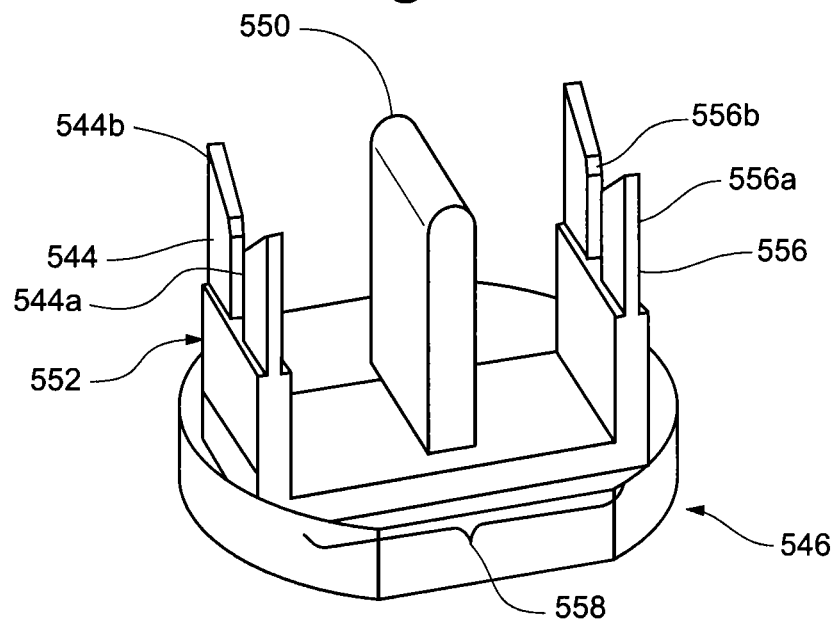
FIG. 37 is a front perspective view of the bypass arrangement of the three-wire LED illumination assembly of FIG. 36.
Figure 38:
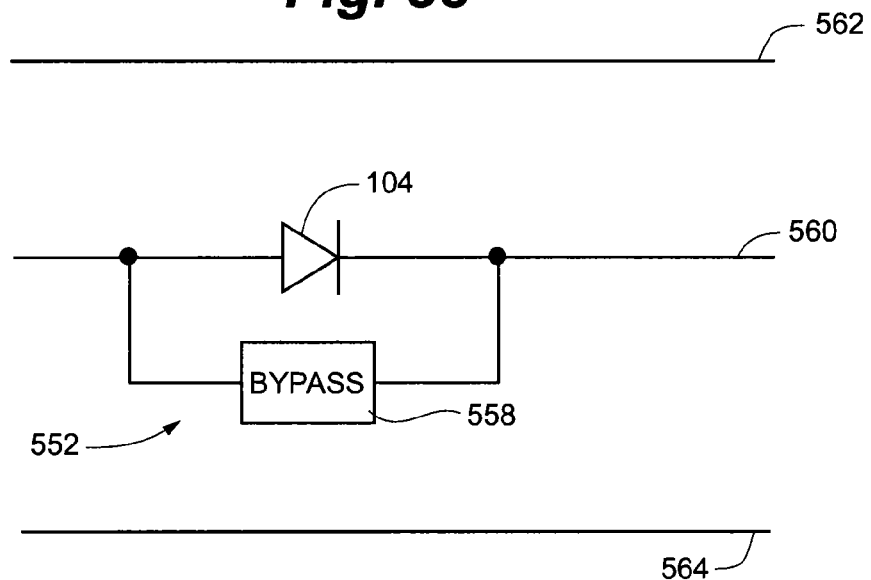
FIG. 38 is an electrical schematic of the three-wire LED illumination assembly of FIG. 36.

Referring to FIGS. 36 to 38, according to an embodiment of the present invention, divider cap 546 can further comprise wire-piercing bypass assembly 552 for preventing the circuit from being electrically broken in the event lamp 504 or its LED chip 104 fails. Bypass assembly 552 comprises a first cutting member 554, a second cutting member 556 and a bypass element 558. First cutting member 554 further comprises a first blade 554a and a second blade 554b. Blades 554a, 554b are spaced such that blades 554a, 554b can cut through the insulation of the wire and contact the conducting portion of the wire. Second cutting member 556 also further comprises a first cutting blade 556a and a second cutting blade 556b arranged in the same manner as first cutting member 554. Selective connecting member 558 operably links first cutting member 554 with second cutting member 556 such that current can flow from first cutting member 554 through bypass element 558 to second cutting member 556.

In operation, first cutting member 554 of bypass assembly 552 is positioned on wire 563 at end 569 proximate to first cutting member 520 of lamp 504 while second cutting member 556 of bypass assembly 552 is positioned proximate to second cutting member 528 of lamp 504 at end 571 of wire 563. In other words, first and second cutting members 554, 556 of bypass assembly 552 are positioned on either side of the gap in the wire 563 to provide a bypass if the path through lamp 504 is broken by a failed or burned out chip carrier 508. Bypass element 558 may comprise a consumable resistive coating over a conductive element, a resistor, a zener diode or any other conventional means of directing current through lamp 504 until chip carrier 508 fails or burns out.

According to an embodiment of the present invention, blade slots 536 are sized to receive both cutting members 520, 528 of lamp 504 and cutting members 554, 556 of bypass assembly 552.

Referring to FIGS. 39 to 44, a triple wire configuration, an alternative LED illumination assembly 559 for lamp 504 with lead frame 506 is depicted. LED illumination assembly 559 is similar to LED illumination assembly 502 in configuration, with the exception that LED illumination assembly 559 further comprises a retention housing 560 having a jumper assembly 562 for operably linking a primary wire 563 pierced by lamp 504 with a secondary wire 565. Secondary wire 565 can comprise the ground wire or return loop of the primary wire 563.

Figure 39:
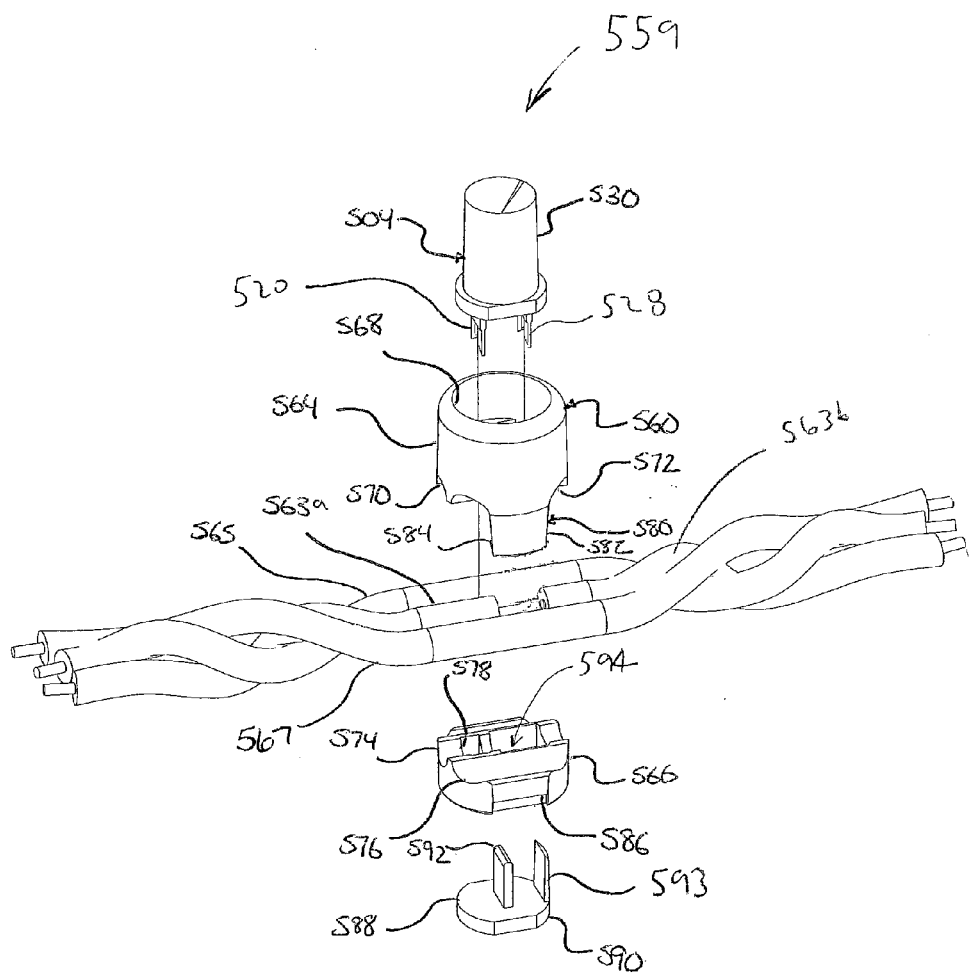
FIG. 39 is a front perspective, exploded view of a three-wire LED illumination assembly including an electrical jumper, according to an embodiment of the present invention.
Figure 40:
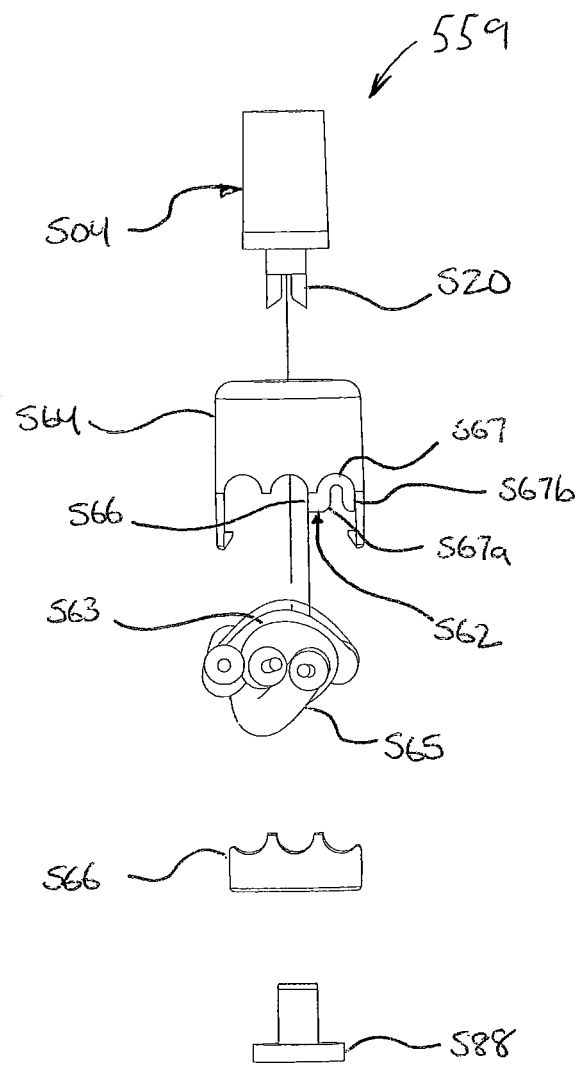
FIG. 40 is a left-side perspective of the three-wire LED illumination assembly of FIG. 39.
Figure 41:
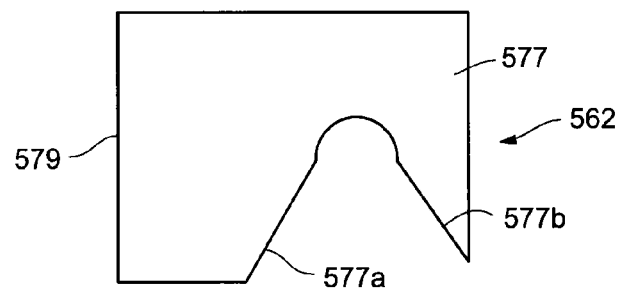
FIG. 41 is a left-side view of the jumper of FIG. 40, according to an embodiment of the present invention.
Figure 42:
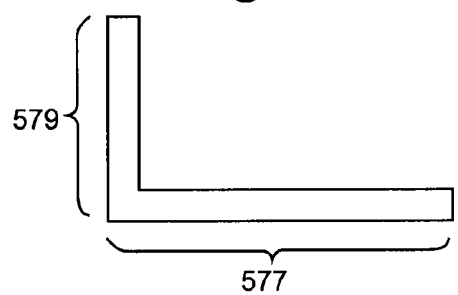
FIG. 42 is a top view of the jumper of FIG. 41.
Figure 43:
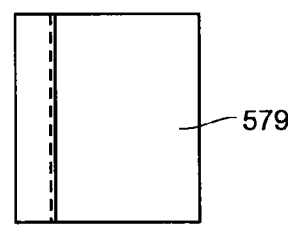
FIG. 43 is a front view of the jumper of FIG. 41.

As depicted in FIGS. 39 and 40, LED illumination assembly 558 comprises a retainer housing 560 for receiving lamp 504. Retainer housing 560 can comprise a housing top portion 564 and a housing bottom portion 566. Housing top portion 564 further comprises a recess 568 for receiving LED lamp 504 and defines a primary groove 570 and at least one secondary groove 572. Housing bottom portion 566 further comprises a primary groove 574 complementing primary groove 570 of housing top portion 564 and a secondary groove 576 complementing each secondary groove 572 of housing top portion 564. Housing bottom portion 566 also comprises at least one blade slot 578 for receiving a portion of either blade member 520, 528. As with retainer housing 532, retainer housing 560 can also comprise a locking assembly 580 having locking arms 582 extending from the bottom of housing top portion 564 and having tabs 584 for engaging housing bottom portion 566. Correspondingly, housing bottom portion 566 can also define a shoulder 586 for operably engaging tabs 584 of housing top portion 564 to lock housing top portion 564 and housing bottom portion 566 together. As shown in FIG. 39, housing top portion 564 and housing bottom portion 566 are interlocked around a gap in the primary wire such that inserting LED lamp 504 into recess 568 forces cutting members 520, 528 into ends of primary wire 536 on opposite sides of the gap in primary wire 536.

As with retainer housing 532, retainer housing 560 can also comprise a divider cap 588 insertable into retention housing 560 opposite LED lamp 504 according to an embodiment of the present invention. Divider cap 588 comprises a cap body 590, a wire divider 592, and positioning and optional tab 593. In this configuration, housing bottom portion 536 further comprises a divider slot 594 positioned proximate to the gap in primary wire 536. Alternatively, blade slot 578 can be sized to receive both wire divider 592 and blade member 520, 528. As shown in FIG. 39, wire divider 592 is inserted through divider slot 594 and positioned within the gap in primary wire 563 to prevent the ends of primary wire 563 for contacting each other and shorting out LED lamp 504.

In an embodiment that includes tab 593, wire 563 may be terminated at lead 520 of LED lamp 504. Such an embodiment may be useful for constructing a decorative light string, as discussed further below with respect to FIGS. 54a to 56. In such an embodiment, illumination assembly 559 includes tab 593, wire portion 563a, but does not include wire portion 563b. Tab 593 extends upwardly into divider slot 594, blocking off the right-side entrance to the wire grooves (alternatively capable of receiving wire portion 563b). Blocking entry to illumination assembly 559 through the grooves prevents an external object from entering illumination assembly 559 and contacting electrified components within the assembly.

In yet another embodiment, tab 593 may not be present, and both wire portions 563a and 563b may be used.

Specifically referring to FIGS. 40 to 43, retainer housing 560 further comprises a jumper assembly 562 operably linking primary wire 563 to secondary wire 567 (as depicted), or in an alternate position, linking wire 563 to wire 565. Jumper assembly 562 comprises a blade wall 577 and a connecting wall 579. As depicted, blade wall 577 forms an approximately right angle with connecting wall 579.

Blade wall 577 further comprises a first cutting blade 577a and a second cutting blade 577b defining a notch 568 between cutting blades 577a, 577b such that cutting blades 577a, 577b can cut through the insulation of the secondary wire 567 and contact the conducting portion of the wire 567 without severing the conduction portion. According to an embodiment of the present invention, notch 568 can comprise a rounded shape conforming to the circular cross-section of the conduction portion of the secondary wire 565.

When assembled, in addition to blade wall 577 piercing and connecting to wire 567, connecting wall 579 along its surface contacts at least a portion of lead frame 502 at lead 528 to form an electrical connection between wire 567 and lead 528. Such an electrical connection may be used when assembly 559 forms a portion of a decorative light set, such as when assembly 559 comprises a last LED lamp 504 in a series of LED lamps.

Figure 44A:
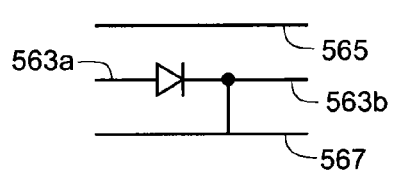
FIG. 44a is an electrical schematic of the three-wire LED illumination assembly of FIG. 39.
Figure 44B:
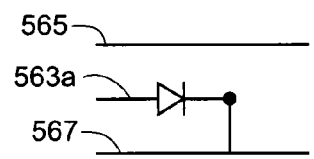
FIG. 44b is another electrical schematic of the three-wire LED illumination assembly of FIG. 39.

An embodiment of a resulting electrical connection is depicted in FIG. 44a, which includes both wire portions 563a and 563b. FIG. 44b depicts an alternate embodiment that terminates wire 563 at assembly 559, such that only wire portion 563a is used, and wire portion 563b is not.

Further, it will be understood that LED lamp 504 may be oriented as shown, with the LED cathode electrically connected to jumper 562 and wire 567, or alternately, with the LED anode electrically connected to jumper 562 and wire 567. It will also be understood that a jumper 562 may connect LED lamp 504 to wire 565, rather than wire 567.

Figure 45:
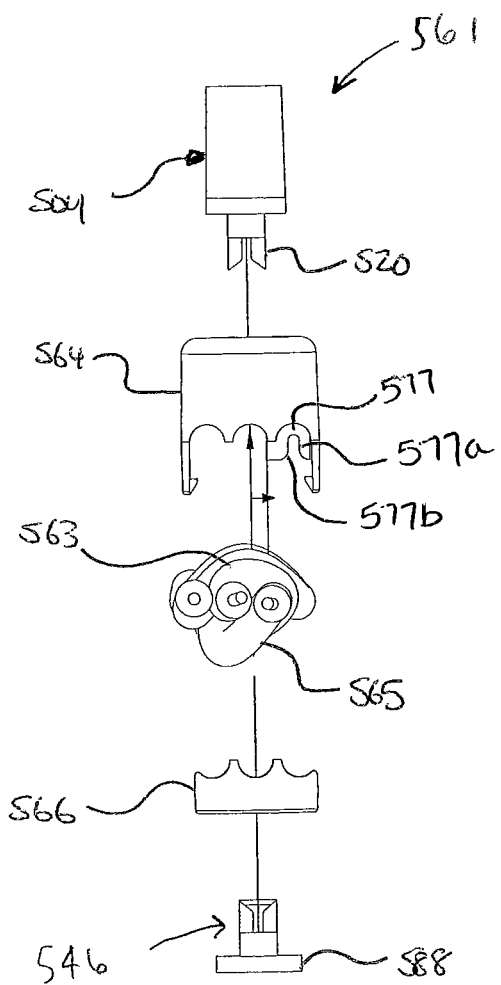
FIG. 45 is a left-side perspective view of a three-wire LED illumination assembly including a jumper and bypass, according to an embodiment of the present invention.
Figure 46:
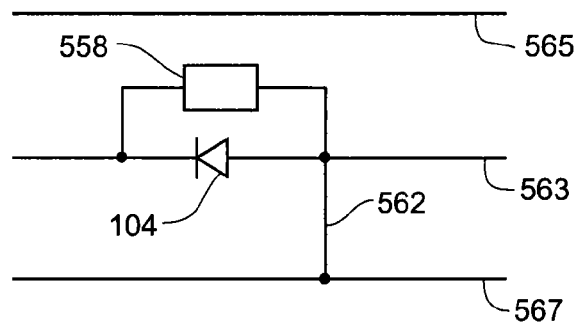
FIG. 46 s an electrical schematic of an embodiment of the three-wire LED illumination assembly of FIG. 45.

Referring to FIGS. 45 and 46, an alternate embodiment of assembly 559, illumination assembly 561, is depicted. Illumination assembly 561 is substantially the same as the embodiment of assembly 559 depicted and described above, except that assembly 561 of FIGS. 45 and 46 includes the bypass feature described above with respect to FIGS. 36-38. In this arrangement, assembly 561 includes both a jumper to connect wires 563 and 567, and a bypass 558 around LED chip 104.

Figure 47:
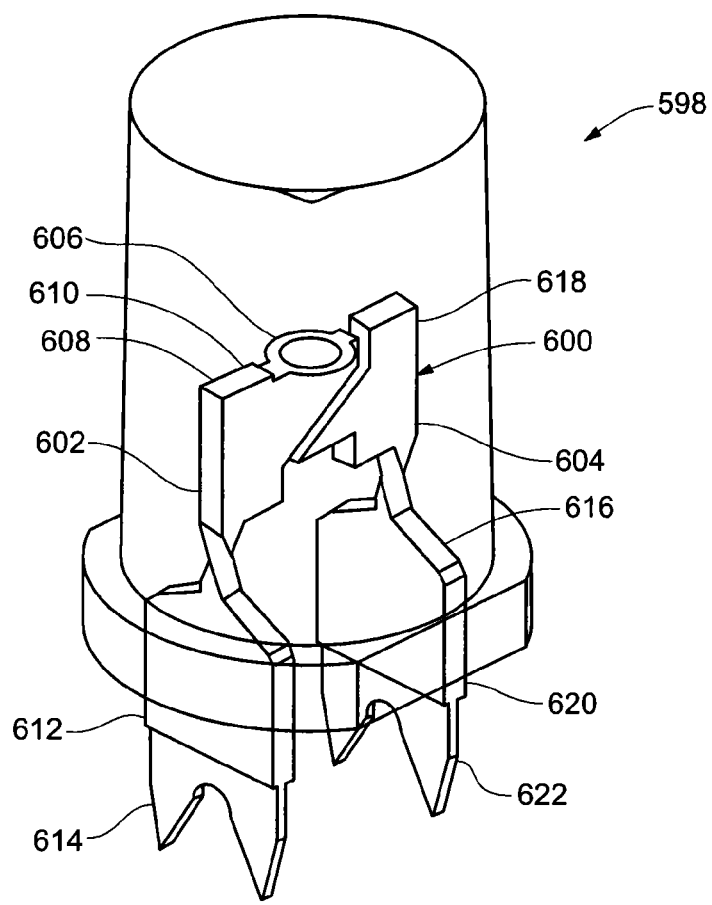
FIG. 47 is a front perspective view of an LED lamp having a twisted-lead LED lead frame, according to an invention of the present invention.

Referring to FIG. 47, an LED lamp 598 having a lead frame 600 for use in single or triple wire configurations is depicted. LED lamp 598 is similar to LED lamp 504; with the exception that LED lamp 598 a twisted first lead 602 and a twisted second lead 604.

Lamp 598 comprises a lead frame 600 having a chip 606, a first lead 602, and a second lead 604. First lead 602 includes a lead body 608 comprising a top portion 610 and an end portion 612 having first cutting member 614. Second lead 604 includes a lead body 616 comprising a top portion 618 and an end portion 620 having a second cutting member 622. As with lamp 504, first and second leads 602, 604 are operably linked to chip 606 such that lead bodies 608, 616 extend generally downward from chip 606.

First and second leads 602, 604 comprise a wishbone shape having a wide, planar top portion 610, 618 and wide, end potion 612, 620 linked by a narrow center. Unlike lamp 504, end portions 612, 620 of first and second leads 602, 604 are twisted relative to top portions 610, 618 such that end portion 612, 620 and top portion 610, 618 of each lead 602, 604 are perpendicular to each other.

In general, lead frame 600 and lamp 598 may be interchanged with lead frames or lamps having leads in two different planes similar to those described above, including, for example, lead frame 454 and lamp 452. However, lead frame 600 may provide manufacturing process advantages over non-twisted lead frames.

More specifically, lead frame 600 may initially be stamped in a planar configuration out of a planar piece of lead frame material, followed by twisting of leads 602 and 604.

Referring to FIGS. 48a to 48c, another embodiment of an LED lead frame, lead frame 700 is depicted. LED lead frame 700 is also manufactured in a planar configuration of a planar piece of lead-frame material. FIG. 48a depicts several lead frames 700 still attached to lead-frame carrier 702, prior to separation of the lead frames 700 from carrier 702. FIG. 48b depicts a left-side view of lead frames 700 connected to lead-frame carrier 702, and FIG. 48c depicts a top view of lead of lead frames 700 connected to lead frame carrier 702.

As depicted, each lead frame 700 includes first lead 704, second lead 706, and chip carrier 708. In an embodiment, chip carrier 708 is integral to second lead 706, while in other embodiments, chip carrier 708 is added as a separate component to second lead 706. Each of first lead 704 and second lead 706 includes a first pair 710 of cutting members 712, a second pair 714 of cutting members 712, and forms a shoulder 716. For any particular lead frame 700, first and second leads 704 and 706 are generally coplanar. All cutting members 712 are generally coplanar to one another, as are pairs 710 and 716. The first and second wire-receiving channels each define a V-shaped opening at a bottom end and an arcuate portion at a top end. A top surface of lead 706 that carries chip carrier 708, and an LED chip, such as a chip 104 (not depicted in FIG. 48, refer generally to FIGS. 1-4), defines a generally horizontal plane that is generally perpendicular to the plane formed by the leads 704, 706, and the cutting members 712. When mounted to chip carrier 708 and second lead 706, a portion of LED chip 104 may be intersected by the lead plane.

First lead 704 may be relative narrow at a top portion, then widen at a bottom portion adjacent pair 710 of cutting members 712. Second lead 706 may be relatively wide at a top portion for the purpose of carrying chip carrier 708, have a relatively narrow middle portion, then widen again at a bottom portion adjacent pair 714 of cutting members 712. Leads 704 and 706 may also include a series of bends and recesses. Such bends and recesses may be in part a result of material saving methods, but also may coincide with a bottom surface of an encapsulating lens or other housing structures in a lamp or lighting assembly (not depicted in FIG. 48) that includes lead frame 700.

During the manufacturing process, lead frame carrier 702 may begin as a generally rectangular, continuous strip of relatively thin conducting material. Portions of lead-frame carrier 702 are stamped or punched out leaving lead frames 700 attached to lead-frame carrier 702 at multiple points 720. Individual lead frames 700 may be cut, bent to break, or otherwise removed from lead-frame carrier 702. Prior to removal from lead-frame carrier 702, additional processing to lead frames 700 may be carried out. Such processing may include adding an LED chip, such as a chip 104, an encapsulating lens, such as a lens 108, or even a housing 106. The addition of a lens 108 over a portion of each of leads 704 and 706 keeps the lead positions fixed relative to one another when removed from lead-frame carrier 702.

Referring to FIGS. 49 to 50c, an embodiment of lighting assembly 730 that includes an embodiment of lead frame 700 is depicted. FIG. 49 depicts an exploded view of lighting assembly 730, FIG. 50a depicts a front view of lighting assembly 730 as fully assembled, though without wires, FIG. 50b depicts a top view of assembly 730, and FIG. 50c depicts a front, cross-sectional view of lighting assembly 730.

Lighting assembly 730 includes LED lamp 732, housing top portion 734, retainer 736, and housing bottom portion 738. Lighting assembly 730 may also include lamp cover 740, as depicted.

LED lamp assembly 732 includes parallel-lead-type lead frame 700, lens 741, and an LED chip 104 (not depicted). Lead frame 700 includes first lead 704 and second lead 706.

Housing top portion 734 includes a generally cylindrical body portion 742 and lower portion 744. Cylindrical body portion 742 defines central recess 744, front, planar surface 745, rear planar surface 746, and a pair of horizontal surfaces 747 at the base of surfaces 745 and 746. As explained further below, recess 744 may be generally cylindrical at a top portion, and wider with flat sides at a bottom portion to receive retainer 736. Lower portion 744 may be integral to body portion 742 and includes left shoulder 748, right shoulder 750, front tab 752, and rear tab 754. Left shoulder 748 and right shoulder 70 each form a horizontal top surface, and downward, and inward angling side surfaces.

Retainer 736 includes a generally cylindrical upper portion 754 extending upward and away from lower portion 756. Upper portion 754 defines one or more lead-frame receiving slots 758. Lower portion 756 as depicted includes arcuate left and right sides 760 and 762, respectively, and generally flat front and rear sides 764 and 766, respectively. Lower portion 756 also defines a generally flat bottom surface 768.

Housing bottom portion 738 includes generally vertical left and right side walls 770 and 772, respectively. Housing bottom portion 738 also defines left shoulder-receiving recess 774, right shoulder-receiving recess 776, bottom surface 778, and wire-channels 780. Housing bottom portion 738 in an embodiment may also define recess 782 which receives tips of each of cutting members 712 that may extend through the wires (not depicted) when assembled. FIG. 52b also depicts recess 782. A distance from an inside surface of the left wall 770 to an inside surface of the second wall 772 in an embodiment is less than a distance from a leftmost portion of left shoulder 748 to a rightmost portion of right shoulder 750.

When assembled, LED lamp 732 fits into the upper portion of recess 744. As depicted in FIG. 50c, a portion of LED lamp 732, including lens 741 may extend above and outside housing top portion 734. First and second leads 704 and 706 project downward into recess 744, and into slots 758 or retainer 754. In an embodiment, retainer 754 may define a single slot 758 to receive leads 704 and 706, or a pair of slots 758, one each to receive lead 704 and 706.

Retainer 736 is inserted upwardly into a bottom portion of recess 744. A bottom of lens 741 may seat against a top of retainer 754 when fully inserted into housing top portion 734 and retainer 736. The bottom portion of recess 744 includes a pair of generally flat surfaces that are adjacent front and back sides 764 and 766 to for a type of keyed fitting, such that retainer 736 does not rotate when inserted into housing top portion 734. In an embodiment, retainer 754 is fully received by housing top portion 734 such that bottom surface 768 is coplanar with a bottom surface of housing top portion 734.

Housing top portion 734 with retainer 736 is inserted into housing bottom portion 738. Although not depicted in FIGS. 49 to 50a, it will be understood that a pair of wires as described above, will be received by grooves or wire channels 780, and held securely in place when housing top portion 734 is fitted to housing bottom portion 738, similar to the housing and wire embodiments described above. Flat front and rear sides of top portion 734 may be used to hold and position top portion 734 relative to bottom portion 738 during assembly. Front and rear tabs 752 and 754 extend frontwardly and rearwardly, respectively, adjacent top surfaces of the wires.

As housing top portion 734 is forced downward into housing bottom portion 738, left side 770 and right side 772 bend or flex outwardly (away from center) to allow left shoulder 748 to align with, and be received by, left recess 774, right shoulder 750 to be aligned with and received by, right recess 776. The receiving of shoulders 748 and 750 into their respective recesses 774 and 776 forms a tight fit between housing top portion 734 and housing bottom portion 738.

When top portion 734 is fit to bottom portion 738, bottom surface 768 and portions of the bottom surface of housing top portion 734 are adjacent the wires and top surface 778 of housing bottom portion 738, and apply a downward force to the wires and to top surface 778. An assembly force may be applied at horizontal surfaces 747 of top portion 734 to bring portions 734 and 738 together during assembly.

Cutting members 712 pierce the wires as described above with respect to other embodiments of the invention, when LED lamp 732 is fully inserted into housing top portion 734, retainer 736, and housing bottom portion 738.

Lamp cover 740, when used, is inserted over lens 741 and into the top portion of recess 744. Lamp cover 740 may be held in place through a friction fit comprising lamp cover 740, lens 741, and housing top portion 734, or alternatively, may be held by other means, including an adhesive.

Consequently, when LED lamp 732, housing top portion 734, retainer 736, and housing bottom portion 738 are assembled on to a pair of wires to form lighting assembly 730, assembly 730 aligns the cutting members 712 such that they can form the proper electrical connection by piercing conductors of the wires, and securely hold the various components snugly and safely together using any combination of friction, compression and snap fitments.

Referring to FIGS. 51*a* and 51*b*, an alternative embodiment of lighting assembly 730 is depicted. The depicted embodiment of lighting assembly 730 is substantially the same as the embodiment depicted in FIGS. 48 to 50*c*, with the addition of clip 784.

Clip 784 in an embodiment is connected to, and adjacent either of left side 770 or right side 772 of housing lower portion 738. In an embodiment, clip 784 is integral to housing lower portion 738.

Clip 784 includes first arm 786 and second arm 788. First and second arms 786 and 788 are generally arcuate, forming a C-shape and opening 790. Opening 790 may be sized to receive a portion of a branch of an artificial tree such that clip 784 may be used to attach lighting assembly 730 to the branch of an artificial tree, thereby forming a lighted artificial tree.

Distal ends 792 and 794 of arms 786 and 788, respectively, may project away from one another to form branch guide 796. When a portion of a branch of an artificial tree is inserted into branch guide 796, and forced towards opening 790, arms 786 and 788 may flex apart, allowing the portion of the branch to fit into opening 790, thusly securing lighting assembly 730 to the branch.

Referring to FIGS. 52*a* and 52*b*, another embodiment of a lighting assembly 730 having clips 800 and 802 is depicted. In this embodiment, clips 800 and 802 are sized to secure lighting assembly 730 to wires or wire-like strands to form a decorative net light.

Clip 800 includes arm 804 extending outwardly and away from housing bottom portion 738, and curved arm 806 which also extends outwardly and away from portion 738, and then towards arm 804. Arms 804 and 806 define an opening 808 for receiving the wires or the wire-like strands. Arms 804 and 806 also define a gap, through which the wires may pass. Clip 802 is substantially the same as clip 800.

Referring to FIGS. 53*a* to 53*c*, an alternate lighting assembly 900 is depicted. This embodiment is similar to lighting assembly 730 as described above with respect to FIGS. 48 to 52*c*. Rather than a separate housing top portion and retainer, lighting assembly 900 includes an integrated housing-retainer 902.

Lighting assembly 900 includes an LED lamp, such as lamp 732, housing-retainer 902, and housing bottom portion 738. In an embodiment, housing-retainer 902 is directly molded onto LED lamp 732. Lens 741 may also be molded onto lead frame 700 to encapsulate an LED chip and portions of lead frame 700, followed by over-molding housing-retainer 902 onto lens 741 and the remainder of LED lamp 732 to form lamp-housing assembly 904.

Lamp-housing assembly 904 may then be connected to housing bottom portion 738 by forcing assembly 904 downwards onto bottom portion 738, causing shoulders 748 and 750 to clip into their respective recesses, and causing members 712 to pierce their respective wires (not depicted), similar to the embodiment described above with respect to FIGS. 48-52*c*.

Referring to FIGS. 54*a* to 56, any combination of the above-described illumination assemblies may be used to construct a decorative light string.

Referring specifically to FIGS. 54*a* to 54*e*, block diagrams depicting electrical schematics of various embodiments of the illumination assemblies described above are depicted.

FIG. 54*a* depicts an electrical schematic of a two-wire illumination assembly 166. This electrical schematic also applies equally to illumination assemblies 420, 452, 450, 730, and 900, though for the sake of description, an illumination assembly 166 will be discussed. Two-wire illumination assemblies, such as illumination assembly 166, may be used in the construction of a parallel configured decorative light string.

FIG. 54*b* depicts a single-wire illumination assembly 210. Such a single-wire illumination assembly may be used in a series or series-parallel decorative light string.

FIGS. 54*c*, 54*d*, and 54*e* depict three-wire illumination assemblies 300, 559*a*, and 559*b*, respectively. Illumination assemblies 559*a* and 559*b* each include a jumper 577, as described above with respect to FIGS. 40 to 44. Three-wire illumination assemblies may be used in the construction of series-parallel decorative light strings which may or may not include an end connector for providing power at an end of the light string opposite the power plug. Referring to FIG. 55, a parallel-configured decorative light string 910 is depicted. Light string 910 includes an optional power plug 912, optional power connector 914, and a plurality of parallel connected, two-wire, illumination assemblies 166 electrically connected in parallel by a pair of wires 922 and 924. Decorative light string 910 may also include an optional power converter 926.

Power plug 912 receives power from an external power source (not depicted), and provides power to LEDs 104 such that they emit light. Power connector 914, sometimes referred to as an "end connector", may be used to provide power to a second light string.

In an embodiment for general use, and for some artificial lighted trees, light string 910 includes power plug 912 and power converter 926. Power plug 912 may be plugged into a wall outlet to receive AC power, such as 120 VAC. Power converter 926 may convert or transform the received 120 VAC voltage to a lower DC voltage, for example, 3 VDC for use with LEDs 104 rated for 3 VDC.

In an embodiment for use with an artificial tree, light string 910 may not include power plug 912, may not include power connector 914, and may be directly connected to bus or power lines of the artificial tree.

Traditional decorative light strings that do not use wire-piercing lamps typically include a number of short wire segments, each end of the wire segment terminating with a crimped-on terminal for making an electrical connection with a bulb within a socket. Such traditional sets require significant assembly time, and are prone to loose connections which may later cause arcing and present a safety hazard.

Unlike such traditional light sets, light set 910 includes two continuous wires 922 and 924 extending from one end of the light set to the other end. Each wire is pierced at multiple points to make electrical connections to illumination assemblies 166, but otherwise are continuous, thus decreasing assembly effort and avoiding connection and other issues associated with traditional light sets. In other embodiments, wires 922 and 924 may be comprise some wire breaks.

Other embodiments of light string 910 may substitute other embodiments of illumination assemblies, including illumination assemblies 420, 452, 450, 730, and 900 as described above, in addition to, or rather than, illumination assembly 166.

Referring to FIG. 56, an embodiment of a series-parallel-configured light string 920 is depicted. Light string 920 includes optional power plug 912, power connector 914, first series-connected light group 928, second series-connected light group 930, and continuous wires 932, 934, 936, and 938.

First light group 928 includes a plurality of illumination assemblies having LEDs electrically connected in series, including illumination assemblies 559*b*, 300 and 559*a*. Illumination assemblies 559*a* and 559*b* are three-wire assemblies, while assemblies 300 are two-wire assemblies.

Second light group 930 includes a plurality of illumination assemblies having LEDs electrically connected in series, including illumination assemblies 559*b*, 210 and 559*a*. Illumination assemblies 559*a* and 559*b* are three-wire assemblies, while assemblies 210 are single-wire assemblies. Single-wire illumination assemblies 210 could be interchanged with two-wire assemblies 300, but for the sake of illustration, second light group 930 includes assemblies that vary from first light group 928.

Wire 932 is continuous from a power plug end of light string 920 to the power connector end, providing power to the first LED of each light group 928 and 930. Wire 930 is also continuous from the power plug end to the power connector end, connected to each last LED in each light group 928 and 930, thereby providing an electrical return path for each light group. Wire 936 connects each LED in series in first light group 928, while wire 938 connects each LED in series in second light group 930. Wires 936 and 938 define a series of gaps within the illumination assemblies, and bridged by LED lamps, as described above with respect to illumination assemblies 166.

The LEDs of light group 928 are electrically connected in series, as are the LEDs of light group 930. Light group 928 is electrically connected in parallel with light group 930. Although only four illumination assemblies for each light group 928 and 930 are depicted, it will be understood that a larger or smaller number of illumination assemblies, and hence LEDs, may comprise a light group.

In an embodiment, light string 920 is powered by a 120 VAC power source, and includes two light groups 928 and 930. Each light group 928 and 930 includes 50 illumination assemblies, or 50 LEDs, each LED receiving approximately 2.4 VAC.

In another embodiment, light string 920 is powered by a 120 VAC power source converted to 12 VDC, and includes ten light groups. Each light group includes four LEDs rated at 3 VDC.

It will be understood that any combination of wire-piercing illumination assemblies with wire-piercing LED lead frames may be used to construct various parallel, series, series-parallel, and parallel series decorative light strings according to embodiments of the present invention.

Although the present invention has been described with respect to the various embodiments, it will be understood that numerous insubstantial changes in configuration, arrangement or appearance of the elements of the present invention can be made without departing from the intended scope of the present invention. Accordingly, it is intended that the scope of the present invention be determined by the claims as set forth. For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A light-emitting diode lamp for piercing insulated wires of a lighting device so as to make electrical contact between the lamp and the wires of the lighting device, the lamp comprising:
   a light-emitting diode lead frame including a conductive first lead and a conductive second lead, the first lead having a first cutting member and a second cutting member;
   a light-emitting diode mounted to the lead frame, the light-emitting diode electrically connected to the first lead and electrically connected the second lead; and
   a lens adjacent the light-emitting diode and covering at least a portion of the first lead and a portion of the second lead so as to fix a position of the portion of the first lead relative to the portion of the second lead.

2. The light-emitting diode lamp of claim 1, wherein the first lead light-emitting defines a wire-receiving recess adjacent the first cutting member.

3. The light-emitting diode lamp of claim 1, wherein the second lead includes a first cutting member.

4. The light-emitting diode lamp of claim 3, wherein the second lead further includes a second cutting member and defines a wire-receiving recess.

5. The light-emitting diode lamp of claim 1, wherein the first lead further includes a transition portion adjacent the cutting member, the transition portion forming a step having a transition surface adapted to contact a top surface of an insulated wire.

6. The light-emitting diode lamp of claim 5, wherein the transition surface defines a plane generally perpendicular to the cutting member of the first lead.

7. The light-emitting diode lamp of claim 1, wherein the first lead and the second lead are substantially coplanar.

8. The light-emitting diode lamp of claim 1, the first lead further including a top portion, a middle portion, and a bottom portion, the bottom portion comprising the cutting member, and the second lead further including a top portion, a middle portion, and a bottom portion, the bottom portion comprising a cutting member, and wherein the middle portion of the first lead and the bottom portion of the first lead project away from a center of the light-emitting diode lead frame in a forward direction such that a distance from the middle portion of the first lead to the center of the light-emitting diode lead frame defines a first offset, and wherein the middle portion of the second lead and the bottom portion of the second lead project away from the center of the LED lead frame in a rearward direction such that a distance from the middle portion of the second lead to the center of the LED lead frame defines a second offset.

9. The light-emitting diode lamp of claim 8, wherein the first offset is substantially the same as the second offset.

10. The light-emitting diode lamp of claim 1, wherein the lead frame forms a Z shape and the first lead further includes a top portion and an end portion coupled to a bottom portion comprising the cutting member of the first lead, the top portion of the first lead forming a first angle with the end portion of the first lead; and the second lead further includes a top portion and an end portion coupled to a bottom comprising a cutting member of the second lead, the top portion of the second lead forming a second angle with the end portion of the second lead.

11. The light-emitting diode lamp of claim 10, wherein the first angle and the second angle are substantially 45 degree angles.

12. The light-emitting diode lamp of claim 1, the first lead further including a top portion and a bottom portion, the second lead further including a top portion and a bottom portion, wherein the top portion of the first lead and the top portion of the second lead define a horizontal plane, the bottom portion of the first lead forms a first vertical plane, the bottom portion of the second lead forms a second vertical plane, and wherein the top horizontal plane is substantially perpendicular to the first vertical plane and the second vertical plane.

13. The light-emitting diode lamp of claim 12, wherein the bottom portion of the first lead and the bottom portion of the second lead are directly opposite one another.

14. The light-emitting diode lamp of claim 1, wherein the first lead further includes a twisted portion and the second lead further includes a twisted portion.

15. The light-emitting diode lamp of claim 1, the lamp further comprising a chip carrier and the light-emitting diode comprising a light-emitting diode chip, wherein the light-emitting diode chip is mounted to the chip carrier, and the chip carrier is mounted to the lead frame.

16. The light-emitting diode lamp of claim 15, wherein the chip carrier comprises a reflective cavity.

17. The light-emitting diode lamp of claim 1, wherein the first lead further includes an integral chip carrier.

18. The light-emitting diode lamp of claim 1, wherein the light-emitting diode is electrically connected to the second lead by a wire bond.

19. The light-emitting diode lamp of claim 1, wherein the lens encapsulates the entire light-emitting diode and a portion of each of the first lead and the second lead.

20. The light-emitting diode lamp of claim 19, wherein the lens comprises an epoxy material.

* * * * *